US006958715B2

(12) United States Patent
Zhou

(10) Patent No.: US 6,958,715 B2
(45) Date of Patent: Oct. 25, 2005

(54) VARIABLE LENGTH DECODING SYSTEM AND METHOD

(75) Inventor: Minhua Zhou, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/822,087

(22) Filed: Apr. 8, 2004

(65) Prior Publication Data

US 2004/0233076 A1 Nov. 25, 2004

Related U.S. Application Data

(63) Continuation-in-part of application No. 09/788,807, filed on Feb. 20, 2001, now abandoned.
(60) Provisional application No. 60/462,501, filed on Apr. 11, 2003.

(51) Int. Cl.[7] ................................................ H03M 7/40
(52) U.S. Cl. ........................................ 341/67; 341/106
(58) Field of Search .................... 341/67, 106, 50–107

(56) References Cited

U.S. PATENT DOCUMENTS

| 3,701,111 | A | | 10/1972 | Cocke et al. |
| 4,899,149 | A | | 2/1990 | Kahan |
| 5,181,031 | A | | 1/1993 | Tong et al. |
| 5,254,991 | A | | 10/1993 | Ruetz et al. |
| 5,751,232 | A | * | 5/1998 | Inoue et al. .................. 341/63 |
| 5,808,570 | A | * | 9/1998 | Bakhmutsky ................ 341/65 |
| 5,825,312 | A | | 10/1998 | D'Ortenzio |
| 6,011,498 | A | * | 1/2000 | Wittig .......................... 341/67 |
| 6,445,314 | B1 | * | 9/2002 | Zhang et al. ................. 341/67 |

OTHER PUBLICATIONS

Efficient Decoding of Prefix Codes, Hirschberg et al., pp. 449–458, Apr. 1990, no date.

\* cited by examiner

*Primary Examiner*—Michael Tokar
*Assistant Examiner*—Linh V. Nguyen
(74) *Attorney, Agent, or Firm*—Carlton H. Hoel; W. James Brady; Frederick J. Telecky, Jr.

(57) ABSTRACT

A method of decoding variable length codes converts a variable length code table into standard format decomposition tables from which a universal variable length decoder can decode. This allows the same universal variable length decoder to decode any variable length code. The memory required to store the standard format decomposition tables is minimized by the conversion process.

4 Claims, 7 Drawing Sheets block diagram of programmable hardware for universal VLD

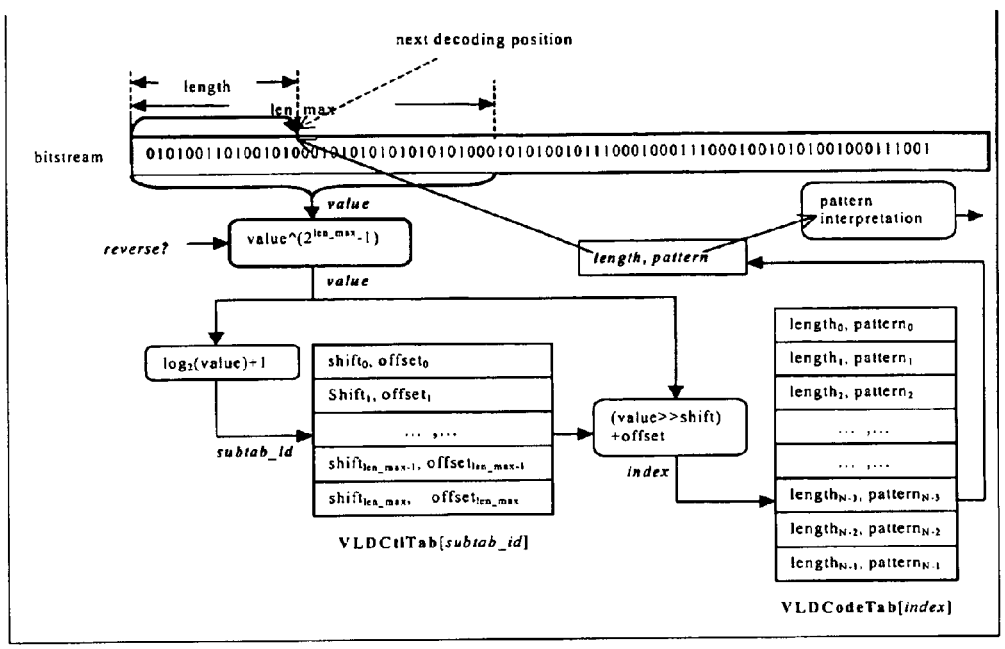
Figure 1a. Diagram of Universal VLD

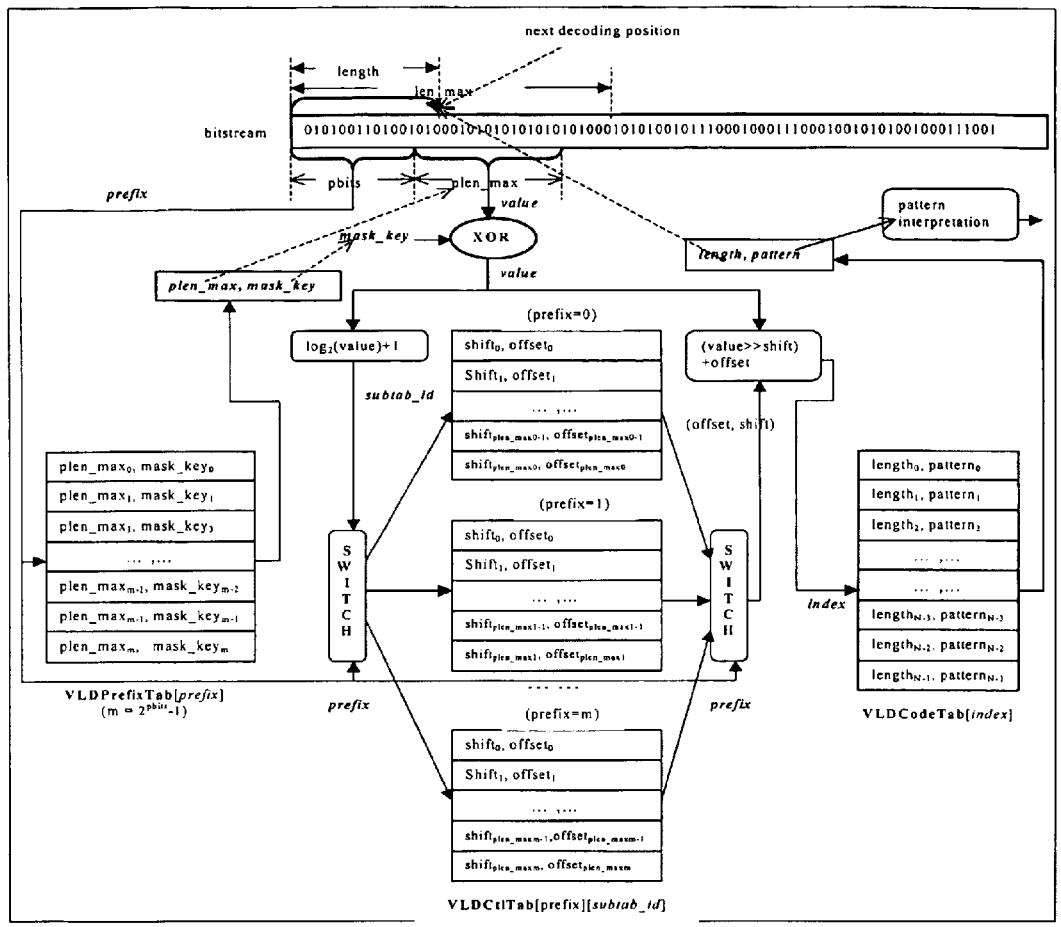
Figure 1b. Principle of Advanced Universal VLD

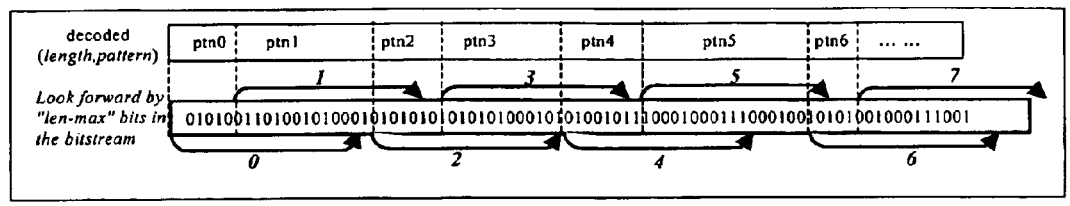
Figure 2. Principle of Variable Length Decoding

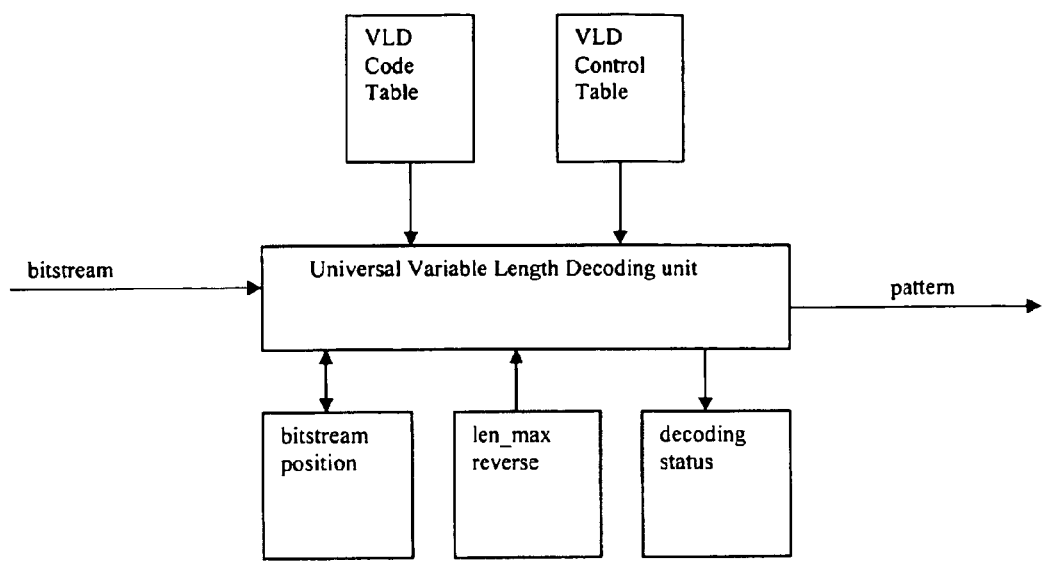
Figure 3a block diagram of programmable hardware for universal VLD

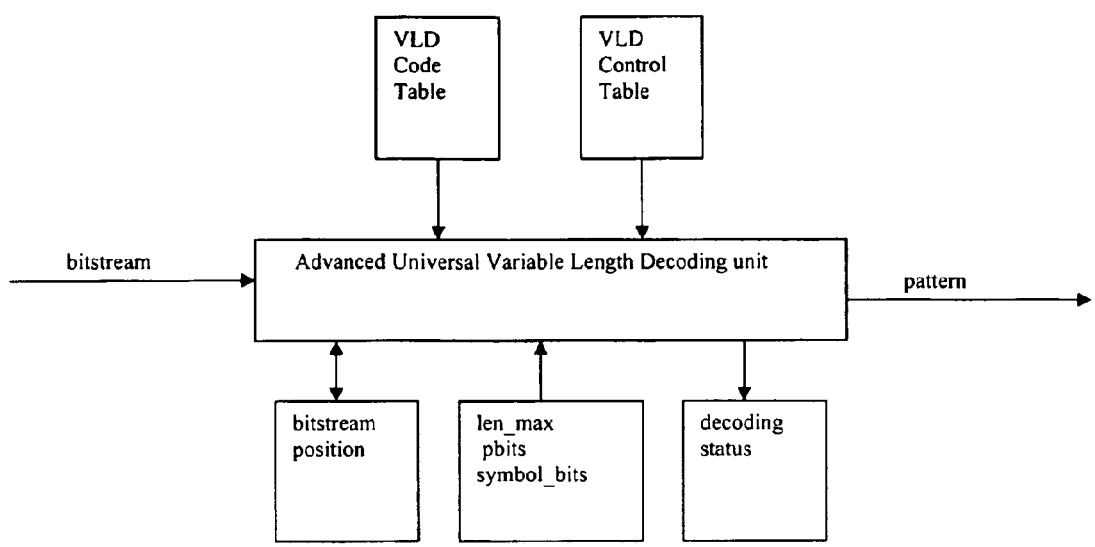
Figure 3b block diagram of programmable hardware for advanced universal VLD

VARIABLE LENGTH DECODING SYSTEM AND METHOD

CROSS-REFERENCE TO RELATED APPLICATIONS

This application claims priority from provisional application No. 60/462,501, filed Apr. 11, 2003 and is a continuation-in-part of pending application Ser. No. 09/788,807, filed Feb. 20, 2001 is now abandon.

BACKGROUND OF THE INVENTION

The present invention relates to electronic systems, and more particularly, to digital systems and methods with bitstreams representing coded information with codewords of variable length.

The current rapid expansion of digital communication (speech, video, and data) relies on increasingly economical digital signal processing and efficient transmission and storage. For example, video communication has general functionality as illustrated in FIG. 4a, and increasingly includes a link through the air interface as illustrated in FIG. 4b. Many digital communication systems and standards, such as MPEG, use coding with variable length codewords for coding efficiency. Variable length decoding (VLD) is needed for decoding bitstreams whenever variable length coding (VLC) is used by the encoder for generating the bitstreams. A VLC table typically has entries with three fields (codeword length: length; pattern or information encoded: pattern; and variable length codeword: vlc_code). VLD is to determine the value of the fields (length, pattern) based on the vlc_code value extracted from the bitstream. FIG. 2 illustrates the principle of VLD. To find and decode the next codeword, the decoder looks at the sequence of bits forward from the current bitstream position and finds a match to a possible value of vlc_code. Based on the extracted vlc_code value, the VLD determines (length, pattern) by look up in the VLC table, outputs the value of pattern as the decoded next codeword, and then updates the current decoding position in the bitstream according to the decoded codeword length, and starts to decode the next codeword. The look for the next codeword usually reads a fixed length of bits (e.g., the maximal codeword length, len_max, of the entire VLC table) and then searches for a possible codeword; see FIG. 2.

Normally, a decoder includes several VLDs to handle multiple VLCs because VLC tables are different from table to table, and VLD functions have to be implemented differently according to the contents of the VLC tables. For a decoder implementation this implies large code size (or high gate count for hardware solutions) and long development times. Therefore, there is a demand to have a universal VLD method that is able to deal with any VLC table in order to reduce costs and increase flexibility in decoder design.

Obviously, the simplest way to do universal VLD is with the direct VLD table look up; that is, each possible sequence of len_max bits in the bitstream is an index to a table entry containing the next codeword length and pattern. However, this requires a huge VLD table size: indeed, a table with $2^{len\_max}$ entries. For example, if the maximum codeword size of a VLC table is 16 bits (i.e., len_max=16), such a VLD table would have 64 K entries. This is too expensive in terms of memory size.

SUMMARY OF THE INVENTION

The present invention provides universal VLD methods including a VLD table construction function and a universal VLD function. The universal VLD function is valid for any VLD as long as the VLD tables are produced by using the VLD table construction function.

This has the advantage of smaller VLD size because a single VLD function can decode multiple VLC codes.

BRIEF DESCRIPTION OF THE DRAWINGS

FIGS. 1a–1c illustrate preferred embodiment universal variable length decoding.

FIG. 2 illustrates variable length decoding (VLD).

FIGS. 3a–3b are block diagrams of a preferred embodiment decoding systems.

DETAILED DESCRIPTION OF THE PREFERRED EMBODIMENTS

1. Overview

Figure 1C:
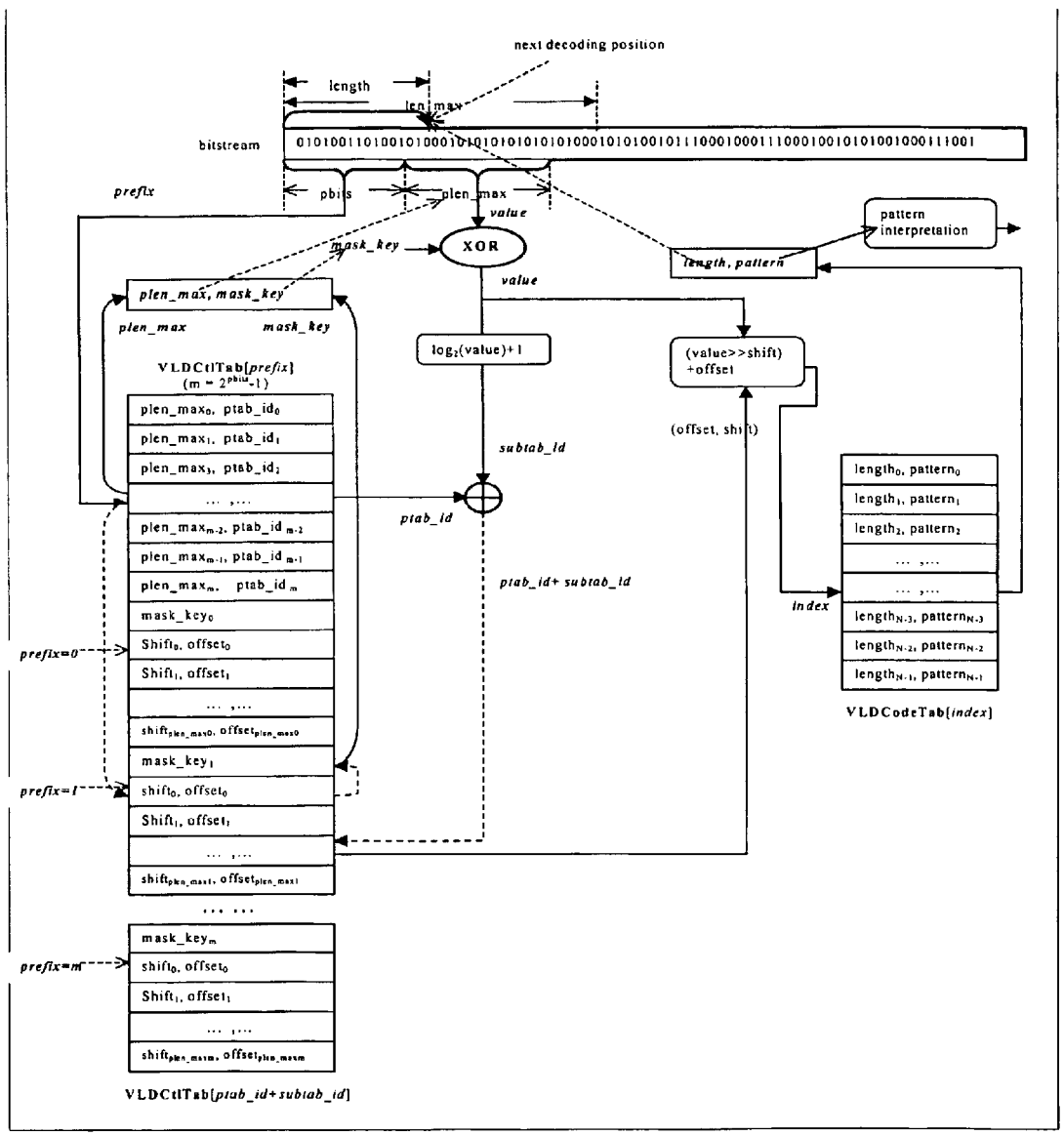
Figure 4A:
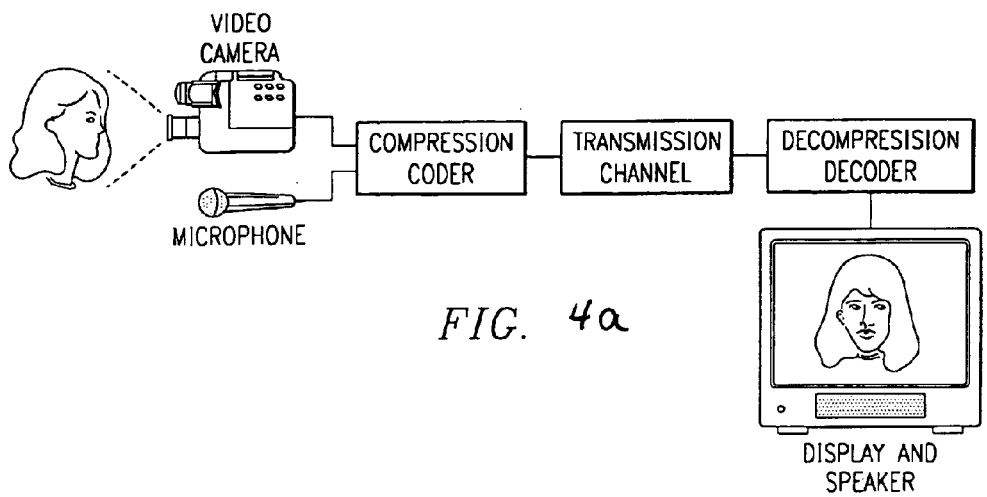
FIGS. 4a–4b show general digital communication which could use preferred embodiment decoding.
Figure 4B:
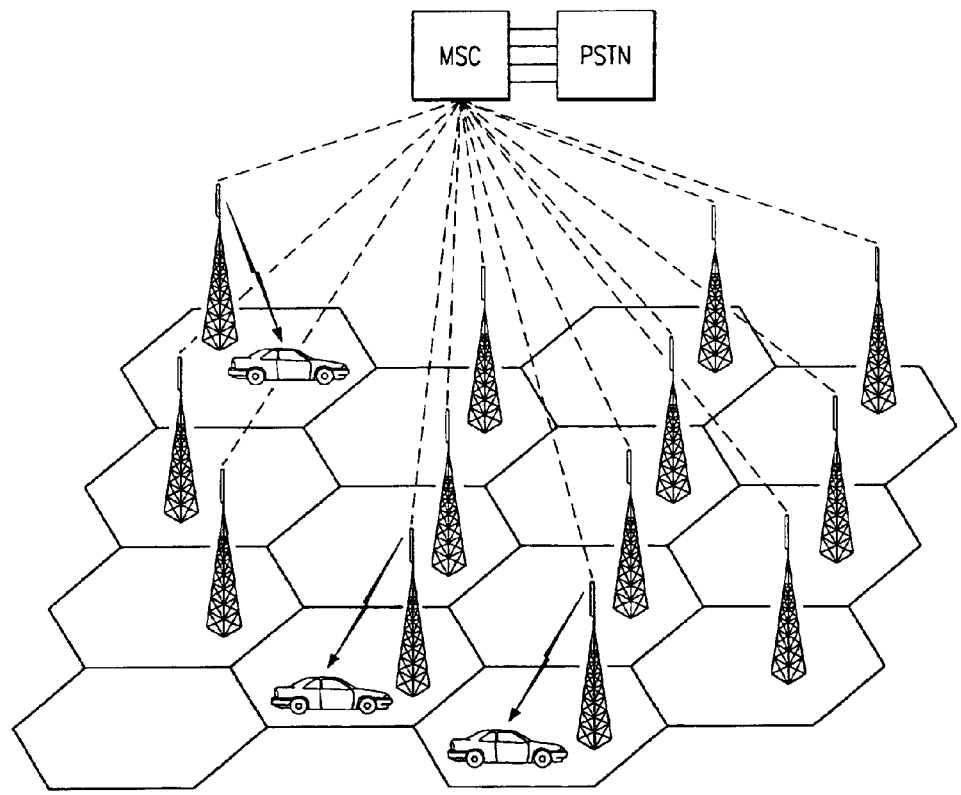

Preferred embodiments include universal variable length decoders and universal variable length decoding (VLD) methods for decoding streams of codewords encoded with variable length coding (VLC). A given VLC table is translated into a VLD control table plus a VLD code table, and a universal variable length decoding (UVLD) use these VLD tables to decode a stream of VLC codewords; see FIG. 1a. A single decoder for bitstreams with differing VLC table encodings simplifies the decoding.

For a given VLC table which is either a 0-leading code table or a 1-leading code table, the VLD code table is not too large and UVLD directly applies. However, for some VLC tables the corresponding VLD code table may require large memory. For such VLC tables, advanced UVLD (AUVLD) partitions a VLC table into prefix-oriented tables with a VLD prefix table plus VLD control and code table construction applied to each prefix-oriented table; see FIG. 1b. AUVLD can effectively handle VLC tables such as the RVLC of DCT coefficients in MPEG-4. And the VLD prefix table can be merged with the VLD control table to minimize storage requirements; see FIG. 1c.

For UVLD the bitstream provides addressing into the VLD control table entries (shift, offset), and these provide addressing into the VLD code table entries (length, pattern) for decoding and moving the read position in the bitstream. Additionally, a reverse indicates bit complementation from 1-leading to 0-leading.

The AUVLD adds prefix parameter (pbits) indicates the number of bits in the bit pattern, prefix, which defines the prefix-oriented tables of a partitioned VLC table, and a reorganization mask (mask_key) provides further memory reduction by optimizing the sizes of the VLD tables constructed from a prefix-oriented table.

The following first considers UVLD without prefixes and then describes AUVLD which extends UVLD with the prefix partitioning of a VLC table.

2. Construction of VLD Code Table and VLD Control Table

Basically, there are two kinds of simple VLC tables: 0-leading tables (e.g. Table 1) and 1-leading tables (e.g. Table 4). First consider the 0-leading tables; a bit reversal will convert 1-leading tables into 0-leading tables. Following sections will consider extensions to more general prefix-oriented VLC tables such as Table 8.

Now an example of a 0-leading VLC table is the following Table 1 which is the MPEG-1 macroblock address increment code table.

TABLE 1

VLC table of MPEG1 Macroblock_address_increment

| length | pattern (macroblock_address_increment) | vlc_code (codeword) |
|---|---|---|
| 1 | 1 | 1 |
| 3 | 2 | 011 |
| 3 | 3 | 010 |
| 4 | 4 | 0011 |
| 4 | 5 | 0010 |
| 5 | 6 | 00011 |
| 5 | 7 | 00010 |
| 7 | 8 | 0000111 |
| 7 | 9 | 0000110 |
| 8 | 10 | 00001011 |
| 8 | 11 | 00001010 |
| 8 | 12 | 00001001 |
| 8 | 13 | 00001000 |
| 8 | 14 | 00000111 |
| 8 | 15 | 00000110 |
| 10 | 16 | 0000010111 |
| 10 | 17 | 0000010110 |
| 10 | 18 | 0000010101 |
| 10 | 19 | 0000010100 |
| 10 | 20 | 0000010011 |
| 10 | 21 | 0000010010 |
| 11 | 22 | 00000100011 |
| 11 | 23 | 00000100010 |
| 11 | 24 | 00000100001 |
| 11 | 25 | 00000100000 |
| 11 | 26 | 00000011111 |
| 11 | 27 | 00000011110 |
| 11 | 28 | 00000011101 |
| 11 | 29 | 00000011100 |
| 11 | 30 | 00000011011 |
| 11 | 31 | 00000011010 |
| 11 | 32 | 00000011001 |
| 11 | 33 | 00000011000 |

Table 1 is used as an example to explain how to construct the VLD code table and the VLD control table from a given VLC table.

The basic idea is to divide the VLC table into a set of sub-tables in a defined order according to the vlc_code values. The sub-table entries make up the VLD code table. For each sub-table there will be a field to indicate the location of the sub-table in the VLD code table, and those fields build up the VLD control table.

The construction of the VLD code table and the VLD control table from a given VLC table has eight steps:

1. Get the maximal length (len_max) of codewords in the VLC table (e.g., len_max=11 for Table 1); and let length denote the length of a codeword.

2. Left shift each VLC codeword (vlc_code) in the VLC table by (len_max-length) bits. For example, the first vlc_code entry in Table 1 is 1 and has a length of 1 bit, so the codeword is left-shifted by 10 bits to yield 1--- ---- ---. After shifting this codeword has a value of 1024 when interpreted as an 11-bit integer; see the last entry in columns "Re-organized vlc_code" and "shifted value" in following Table 2 which illustrates items in the construction of the VLD tables from Table 1. That is, treat the left shifting as adding 10 0-bits, so the shifted codeword would be 1000 0000 000 which, as a binary integer, equals 1024.

3. Reorder the shifted VLC codewords into increasing order according to the vlc_code values after shifting (column "shifted value" in Table 2).

4. Divide the VLC table into sub-tables according to the shifted values. A reorganized VLC codeword is classified into sub-table if its shifted value satisfies $2^{n-1} \leq \text{value} < 2^n$. The variable subtab_id is used to denote n in the decoding. Sub-table0 is an exception and contains only one zero element. By classifying sub-tables in this way it is easy to identify to which sub-table index, subtab_id, a given shifted value belongs, because the sub-table index can be simply determined by checking the MSB position of the shifted value. This is the same as the sub-table number for shifted vlc_code being 11−(the number of leading 0s in vlc_code).

5. Fill up the leaks in each sub-table. Leaks are defined as codeword entries that are valid but not used in the VLC table. For example, in Table 2 all the entries in sub-table0, sub-table1, sub-table2, sub-table3, and sub-table4 plus the entries below shifted value 24 in sub-table5 are missing because those entries are not used in the VLC table (see Table 1). For the purpose of error detection, those leaks must be filled with dummy codewords. In Table 2, the leaks are filled with the dummy code (0,0) for (length, pattern) in the central column and correspond to potential-but-not-used codewords shown underlined in column "Re-organized vlc_code". Whenever a decoder extracts a dummy code (0,0) from the bitstream, it will report a finding of error.

6. Determine shift for each sub-table where shift for a sub-table is defined as the difference between len_max and the maximal length of the codewords in the sub-table. For example, sub-table6 of Table 2 has codewords varying in length from 8 to 11 bits, thus shift equals 0 The VLD control table has shift as the first field component; see Table 2, left column "VLD-control (shift, offset)". In effect, shift is the minimum shift of all of the codewords in the sub-table and will be applied in the decoding to convert a set of bits of length len_max from the bitstream to approximate codeword size. For example, sub-table7 has vlc_code varying from 7 to 8 bits, so shift=3; then for vlc_code=0000 111 the corresponding len_max bits from the bitstream (0000 111x xxx) after left shifting by shift would be 0000 111x where x is either 0 or 1.

7. Determine the entry indices in the VLD code table by simple enumeration starting at 0 in sub-table0. Each element (length, pattern) is repeated $2^{len\_max\text{-}shift\text{-}length}$ times in the VLD code table; this means the approximate codeword suffices because the repetition allows for the irrelevant x. As an example, in sub-table7 of Table 2, the center column (which are the VLD code table entries (length, pattern) expressed in decimal) and Table 3 which lists these entries, the entry (7, 8) appears twice because (len_max=11, shift=3, length=7). That is, the VLD code table indices 70 and 71 (column "VLD code index" of Table 2) both appear for (7,8). and in the corresponding VLD code table (VLDCodeTab[79] of Table 3), the $70^{th}$ and $71^{st}$ components in the array of 79 components are both (7,8). This repetition accounts for the unequal length of codewords in the sub-table (the irrelevant x bits) and makes universal decoding simpler.

8. Determine offset for each sub-table so that any entry in the sub-table can fin its index in the VLD code table by the equation: index=offset+(value>>shift), where value is the entry in the column "shifted value" in Table 2. Thus offset for a sub-table aligns the index with the unshifted value. Note that decoding "shifted value" here is equivalent to the value of the sequence of len_max bits starting at the current decoding position in the bitstream in that the binary value of the len_max bits is in the range of the sub-table. For example, the second entry of sub-table10 of Table 2 has shift 8, index 77, and vlc_code 011- ---- ---; the 8-'s are the left shift of 8, so (value>>shift) is 3 (binary 011) and offset=index−(value>>shift)=77−3=74. The VLD control table has offset as the second field component.

TABLE 2

Design of UVLD code table and VLD control table
for MPEG1 Macroblock_address_increment

| VLD control (shift, offset) | VLD code index | VLD code (length, pattern) | Re-organized vlc_code | shifted value |
|---|---|---|---|---|
| | | Sub-table0 (0~0) | | |
| (0, 0) | 0~0 | (0, 0) | 0000 0000 000 | 0 |
| | | Sub-table1 (1~1) | | |
| (0, 0) | 1~1 | (0, 0) | 0000 0000 001 | 1 |
| | | Sub-table2 (2~3) | | |
| (0, 0) | 2~3 | (0, 0) | 0000 0000 010 | 2~3 |
| | | (0, 0) | 0000 0000 011 | |
| | | Sub-table3 (4~7) | | |
| (0, 0) | 4~7 | (0, 0) | 0000 0000 100 | 4~7 |
| | | ~ | ~ | |
| | | (0, 0) | 0000 0000 111 | |
| | | Sub-table4 (8~15) | | |
| (0, 0) | 8~15 | (0, 0) | 0000 0001 000 | 8~15 |
| | | ~ | ~ | |
| | | (0, 0) | 0000 0001 111 | |
| | | Sub-table5 (16~31) | | |
| (0, 0) | 16~23 | (0, 0) | 0000 0010 000 | 16~23 |
| | | ~ | ~ | |
| | | (0, 0) | 000 0010 111 | |
| | 24 | (11, 33) | 0000 0011 000 | 24 |
| | 25 | (11, 32) | 0000 0011 001 | 25 |
| | 26 | (11, 31) | 0000 0011 010 | 26 |
| | 27 | (11, 30) | 0000 0011 011 | 27 |
| | 28 | (11, 29) | 0000 0011 100 | 28 |
| | 29 | (11, 28) | 0000 0011 101 | 29 |
| | 30 | (11, 27) | 0000 0011 110 | 30 |
| | 31 | (11, 26) | 0000 0011 111 | 31 |
| | | Sub-table6 (32~63) | | |
| (0, 0) | 32 | (11, 25) | 0000 0100 000 | 32 |
| | 33 | (11, 24) | 0000 0100 001 | 33 |
| | 34 | (11, 23) | 0000 0100 010 | 34 |
| | 35 | (11, 22) | 0000 0100 011 | 35 |
| | 36~37 | (10, 21) | 0000 0100 10- | 36 |
| | 38~39 | (10, 20) | 0000 0100 11- | 38 |
| | 40~41 | (10, 19) | 0000 0101 00- | 40 |
| | 42~43 | (10, 18) | 0000 0101 01- | 42 |
| | 44~45 | (10, 17) | 0000 0101 10- | 44 |
| | 46~47 | (10, 16) | 0000 0101 11- | 46 |
| | 48~55 | (8, 15) | 0000 0110 --- | 48 |
| | 56~63 | (8, 14) | 0000 0111 --- | 56 |
| | | Sub-table7 (64~127) | | |
| (3, 56) | 64 | (8, 13) | 0000 1000 --- | 64 |
| | 65 | (8, 12) | 0000 1001 --- | 72 |
| | 66 | (8, 11) | 0000 1010 --- | 80 |
| | 67 | (8, 10) | 0000 1011 --- | 88 |
| | 68~69 | (7, 9) | 0000 110- --- | 96 |
| | 70~71 | (7, 8) | 0000 111- --- | 112 |
| | | Sub-table8 (128~255) | | |
| (6, 70) | 72 | (5, 7) | 0001 0--- --- | 128 |
| | 73 | (5, 6) | 0001 1--- --- | 192 |
| | | Sub-table9 (256–511) | | |
| (7, 72) | 74 | (4, 5) | 0010 ---- --- | 256 |
| | 75 | (4, 4) | 0011 ---- --- | 384 |
| | | Sub-table10 (512–1023) | | |
| (8, 74) | 76 | (3, 3) | 010- ---- --- | 512 |
| | 77 | (3, 2) | 011- ---- --- | 768 |
| | | Sub-table11 (1024–2047) | | |
| (10, 77) | 78 | (1, 1) | 1--- ---- --- | 1024 |

Given the following data types:

```
typedef struct vldcodetab {
    char length;
    short pattern;
} VLDCodeTab;
typedef struct vldctltab {
    char shift;
    short offset;
} VLDCtlTab;
```

VLD code table and VLD control table for VLC Table 1 are shown in Table 3.

TABLE 3

UVLD code table and UVLD control table for
MPEG1 macroblock_address_increment

```
static VLDCodeTab Macroblock_address_increment_vldtab[79]={
    {0, 0}, {0, 0}, {0, 0}, {0, 0}, {0, 0}, {0, 0}, {0, 0}, {0, 0},
    {0, 0}, {0, 0}, {0, 0}, {0, 0}, {0, 0}, {0, 0}, {0, 0}, {0, 0},
    {0, 0}, {0, 0}, {0, 0}, {0, 0}, {0, 0}, {0, 0}, {0, 0}, {0, 0},
    {11, 33}, {11, 32}, {11, 31}, {11, 30}, {11, 29}, {11, 28}, {11, 27},
    {11, 26},
    {11, 25}, {11, 24}, {11, 23}, {11, 22}, {10, 21}, {10, 21}, {10, 20},
    {10, 20},
    {10, 19}, {10, 19}, {10, 18}, {10, 18}, {10, 17}, {10, 17}, {10, 16},
    {10, 16},
    {8, 15}, {8, 15}, {8, 15}, {8, 15}, {8, 15}, {8, 15}, {8, 15},
    {8, 15},
    {8, 14}, {8, 14}, {8, 14}, {8, 14}, {8, 14}, {8, 14}, {8, 14},
    {8, 14},
    {8, 13}, {8, 12}, {8, 11}, {8, 10}, {7, 9}, {7, 9}, {7, 8}, {7, 8},
    {5, 7}, {5, 6}, {4, 5}, {4, 4}, {3, 3}, {3, 2}, {1, 1}
};
static VLDCtlTab Macroblock_address_increment_vldctl[12]={
    {0, 0}, {0, 0}, {0, 0}, {0, 0}, {0, 0}, {0, 0}, {0, 0}, {3, 56},
    {6, 70}, {7, 72}, {8, 74}, {10, 77}
};
len_max = 11; reverse = 0;
```

That is, the VLD construction function converts VLC Table 1 into the VLD code table and the VLD control table shown in Table 3. Note that the original VLC Table 1 has 33 entries (length, pattern, vlc_code); whereas, the VLD code table has 79 entries (length, pattern) and the VLD control table has 12 entries (shift, offset). In effect, the preferred embodiment has translated VLC Table 1 into two tables which may aggregately be larger, but this translation will allow application of a universal decoding function. Note that the number of repetitions in the VLD code table depends upon the variance of codeword length for codewords with the same number of leading 0s (which will be in the same sub-table). Section 3 describes a universal VLD decoding using the VLD control table and the VLD code table instead of a decoder specialized for the original VLC table.

Now consider the VLD construction function applied to a 1-leading VLC table such as the following Table 4 example which is a 1-leading VLC table and used for the MPEG1 dct_dc_size_luminance.

TABLE 4

VLC table of MPEG1 dct_dc_size_luminance

| length | pattern (dct_dc_size_luminance) | vlc_code |
|---|---|---|
| 3 | 0 | 100 |
| 2 | 1 | 00 |
| 2 | 2 | 01 |

TABLE 4-continued

VLC table of MPEG1 dct_dc_size_luminance

| length | pattern (dct_dc_size_luminance) | vlc_code |
|---|---|---|
| 3 | 3 | 101 |
| 3 | 4 | 110 |
| 4 | 5 | 1110 |
| 5 | 6 | 11110 |
| 6 | 7 | 111110 |
| 7 | 8 | 1111110 |

The VLD table construction for a 1-leading VLC table is similar to that of a 0-leading VLC table. The difference lies in re-organization of the vlc_codes. In a 1-leading table, the shifted value of a vlc_code is computed by first performing a bit-reversal (interchange 0 and 1 and indicated by the value of reverse) of the vlc_code followed by a left shift of (len_max−length) bits (see Table 5, column "shifted value"), where length is again the codeword length of vlc_code. After this computation of shifted value, the same steps as described above for 0-leading codes are used to construct the VLD code table and the VLD control table: see Table 5 and Table 6.

TABLE 5

Design of VLD code table and VLD control table for MPEG1 dct_dc_size_luminance

| VLD control (shift, offset) | VLD code index | VLD code (length, pattern) | Re-organized vlc_code | Shifted Value |
|---|---|---|---|---|
| | | Sub-table0 (0~0) | | |
| (0, 0) | 0 | (0, 0) | 1111 111 | 0 |
| | | Sub-table1 (1~1) | | |
| (0, 0) | 1 | (7, 8) | 1111 110 | 1 |
| | | Sub-table2 (2~3) | | |
| (1, 1) | 2 | (6, 7) | 1111 10- | 2 |
| | | Sub-table3 (4~7) | | |
| (2, 2) | 3 | (5, 6) | 1111 0-- | 4 |
| | | Sub-table4 (8~15) | | |
| (3, 3) | 4 | (4, 5) | 1110 --- | 8 |
| | | Sub-table5 (16~31) | | |
| (4, 4) | 5 | (3, 4) | 110- --- | 16 |
| | | Sub-table6 (32~63) | | |
| (4, 4) | 6 | (3, 3) | 101- --- | 32 |
| | 7 | (3, 0) | 100- --- | 48 |
| | | Sub-table7 (64~127) | | |
| (5, 6) | 8 | (2, 2) | 01-- --- | 64 |
| | 9 | (2, 1) | 00-- --- | 96 |

TABLE 6

VLD Code table and VLD control table for MPEG1 dct_dc_size_luminance

```
static VLDCodeTab Dct_dc_size_luminance_dcdtab[10]={
    {0, 0}, {7, 8}, {6, 7}, {5, 6}, {4, 5}, {3, 4}, {3, 3}, {3, 0},
    {2, 2}, {2, 1}
};
static VLDCtlTab Dct_dc_size_luminance_dcdctl[8]={
    {0, 0}, {0, 0}, {1, 1}, {2, 2}, {3, 3}, {4, 4}, {4, 4}, {5, 6}
};
len_max = 7; reverse = 1;
```

As Table 3 and Table 6 show, the size of a VLD control table is fixed; it has len_max+1 entries. However, the size of a VLD code table varies from table to table, it depends on the VLC table characteristics.

The construction of the VLD code table and the VLD control table as in the foregoing for any given VLC table can be automated; this includes the decision whether the input VLC table is treated as a 0-leading table or a 1-leading table.

3. Universal VLD Decoding

The construction of the VLD code table and the VLD control table for a VLC table allows a universal VLD decoding function for decoding. Table 7 illustrates the pseudo code for an implementation of a universal VLD decoding function.

TABLE 7

Pseudo code for the universal VLD decoding function

```
int UniversalVLD(
    Bitstream *stream,      /* pointer of bitstream                       */
    VLDCodeTab *vldtab,     /* pointer of VLD table                       */
    VLDCtlTab *vldctl,      /* pointer of VLD control table               */
    int len_max,            /* maximum code length in the VLD table       */
    char reverse,           /* reverse =0/1 -> zero/one leading VLD table */
    char *err_flag)         /* err_flag =1 ->error detected, err_flag=0->decoding OK */
{
    int value, subtab_id, index;
    /*========================================================================*/
    /* get the value of next "len_max" bits in the bitstream                  */
    /*========================================================================*/
    value = next_bits(stream, len_max);
    /*========================================================================*/
    /* reverse the value for 1-leading VLD table                              */
    /*========================================================================*/
    if (reverse) value = ((1<<len_max)−1)^value;
    /*========================================================================*/
    /* determine the sub-table index according to the value. TMS320C6X and TMS320C54X have*/
```

TABLE 7-continued

Pseudo code for the universal VLD decoding function

```
    /* special instructions for such an operation                           */
    /*========================================================================*/
    if (value= =0) subtab_id = 0; else subtab_id = (int) log2(value) + 1;
    /*========================================================================*/
    /* get index in the VLD code table                                      */
    /*========================================================================*/
    index = vldctl[subtab_id].offset + (value>>vldctl[subtab_id].shift);
    /*========================================================================*/
    /* decide if an decoding error is detected                              */
    /*========================================================================*/
    if (vldtab[index].length = =0) *err_flag=1; else *err_flg=0;
    /*========================================================================*/
    /* update the current decoding position in the bitstream                */
    /*========================================================================*/
    if (*err_flg= =0) flush_bits(stream, vldtab[index].length);
    /*========================================================================*/
    /* return the decoded coding pattern                                    */
    /*========================================================================*/
    return vldtab[index].pattern;
}
```

The universal VLD decoding function contains the following steps:

1. Get the value of the next len_max bits in the bitstream; that is, interpret the next len_max bits as a binary integer.
2. If the VLC is a 1-leading table, then reverse the bits of value bit-by-bit.
3. Determine the sub-table index (subtab_id) for addressing the VLD control table according to the value: if value=0, then the subtab_id is 0; otherwise, subtab_id=(int) $\log_2$(value)+1.
4. Get shift and offset from the VLD control table by using the subtab_id address.
5. Compute the index in the VLD code table as index=(value>>shift)+offset.
6. Acquire the codeword length and codeword pattern from the VLD code table entry at index.
7. Update the current decoding position in the bitstream by using length, and interpret pattern to recover the encoded symbol.
8. Loop to step 1.

This function is universal in the sense that it can deal with any VLC table provided that corresponding VLD code table and VLD control table are constructed according to the foregoing description. Further, this function has the ability to perform error detection. FIG. 1a illustrates the decoding.

FIG. 3a is a block diagram of preferred embodiment universal VLD decoding function. The core of this function is the universal VLD unit, which includes data memory and registers connected to it. The data memory is used to store the VLD code table and the VLD control table, while the three registers are used to store the bitstream decoding position, len_max/reverse, and the decoding status (i.e. err_flag). To decode pattern, the universal VLD decoding unit points to the related VLD code table and VLD control table, then extracts the pattern from the bitstream according to the given bitstream position and len_max/reverse. After decoding the pattern, the bitstream position register as well as the decoding status register are updated.

The preferred embodiment universal VLD system is made up of two functions: a VLD table construction function and a universal VLD decoding function. The VLD table construction function constructs the VLD code table and the VLD control table according to the given VLC table; this can be done offline and stored prior to actual decoding. The universal VLD decoding function is valid for decoding any VLC as long as its VLC table is translated into a VLD code table plus a VLD control table according to the foregoing format. In addition, it provides the error detection ability that is essential for decoding a VLC in real applications.

4. Advanced UVLD

Further preferred embodiment universal variable length decoding has a two-tier decomposition of a VLC table: each codeword is assigned to a prefix-oriented (prefix-labeled) table defined by a fixed-bit-length prefix (left-most bits) of the codeword. Then from each prefix-oriented table construct a control table and a code table as described in the preceding UVLD sections. Also, an auxiliary table of prefixes and mask keys (used for reorganizations of codewords within prefix-oriented tables prior to control table and code table constructions) provides the addressing to the appropriate prefix-oriented table constructs from the bitstream. This extends the UVLD described in the preceding sections for 0-leading or 1-leading VLC tables which can be considered as having a single prefix-oriented table with a prefix length of 0 and a mask key of all 0s or all 1s according to reverse, respectively. The preferred embodiments are termed Advanced UVLD or AUVLD and overcome a decoder memory size problem with UVLD for certain VLC codes by computing the required tables for each possible prefix length and picking the prefix length which minimizes memory use.

In particular, presume a given VLC table, then for each value of the integer pbits in the range 0≦pbits<len_max, where len_max is the maximum codeword bit length (exclusive of a suffixed sign bit) in the VLC table, proceed as follows:

1. Divide the given VLC table into $2^{pbits}$ prefix-oriented tables by using the first (left) pbits bits of a codeword (exclusive of a suffixed sign bit) as its prefix; strip off the prefix bits to define the codeword in the prefix-oriented table.
2. Within each prefix-oriented table, apply a mask_key to reorganize the table entries; repeat for all possible mask keys with selection of mask_key to minimize memory requirements.
3. After the prefix-oriented table reorganization based on mask_key, use the prefix-oriented table to construct a VLD code table and a VLD control table as previously described for a general VLC table; that is, an AUVLD control table and an AUVLD code table are constructed for each prefix-oriented table with each mask_key.

4. Compute memory required for storage of the various tables and pick the values of pbits and available mask_key which minimize the memory requirement; this defines the AUVLD control and code tables for the prefix-oriented code tables. Also include a AUVLD prefix table which contains the mask_key and translates bitstream bits into the addresses to entries in the control and code tables plus mask_key for decoding.

In more detail, for a given value for pbits plus a given VLC table, first decompose the VLC table into $2^{pbits}$ prefix-oriented tables. Let (length, pattern, vlc_code) represent an entry in the VLC table where length is the codeword length in bits (excluding any sign-bit suffix), pattern is the symbol being encoded (such as the last/run/level of Table 8), and vlc_code is the corresponding codeword; also let len_max be the maximum of length in the VLC code table. A VLC code table entry (length, pattern, vlc code) is classified into the prefix-oriented table labeled prefix when the first pbits bits of the codeword (with left padded 0s if needed) have a value equal to prefix; that is, (vlc_code>>(length−pbits))= prefix.

A prefix-oriented table can have none, one, or multiple entries, depending upon the given VLC code table. The first pbits of each codeword are then stripped off to form the entry in the prefix-oriented table. Therefore, the counterpart of an entry (length, pattern, vlc_code) from the VLC code table is the entry (length-pbits, pattern, vlc_code & ($2^{length-pbits}-1$)) in the appropriate prefix-oriented table where & indicates bitwise AND.

For a more detailed explanation, consider the example of the MPEG-4 reversible variable length coding of the DCT coefficients for interceded frame macroblocks; the VLC code table (Table 8) has 170 entries. This is a run-length type of coding where a DCT coefficient to be encoded is represented by three numbers: "last" (1-bit), "run" (6-bit), and "level" (5-bit) which make up the 12-bit pattern of the entry in the VLC code table. Disregarding any suffixed sign bit, length varies from 3 to 15; see following Table 8. Note that in the table the 12-bit pattern and the codeword are both expressed in decimal for compactness.

TABLE 8

MPEG4 RVLC INTER VLC table.

Static CodTab MPEG4_RVLC_INTER_DCT_TAB[170]={/*
{code_length, code_word, code_pattern}
{3, 6, 1}, {3, 7, 33}, {4, 1, 2}, {4, 10, 65}, {4, 11, 2049},
{5, 4, 3}, {5, 5, 97}, {5, 8, 129}, {5, 9, 161}, {5, 18, 2081},
{5, 19, 2113}, {6, 12, 34}, {6, 13, 193}, {6, 20, 225}, {6, 21, 257},
{6, 24, 2145}, {6, 25, 2177}, {6, 34, 2209}, {6, 35, 2241}, {7, 28, 4},
{7, 29, 66}, {7, 44, 289}, {7, 45, 321}, {7, 52, 353}, {7, 53, 2273},
{7, 56, 2305}, {7, 57, 2337}, {7, 66, 2369}, {7, 67, 2401}, {8, 60, 5},
{8, 61, 6}, {8, 92, 35}, {8, 93, 98}, {8, 108, 130}, {8, 109, 385},
{8, 116, 417}, {8, 117, 449}, {8, 120, 2050}, {8, 121, 2433},
{8, 130, 2465},
{8, 131, 2497}, {9, 124, 7}, {9, 125, 36}, {9, 188, 67}, {9, 189, 162},
{9, 220, 481}, {9, 221, 513}, {9, 236, 545}, {9, 237, 2082},
{9, 244, 2529},
{9, 245, 2561}, {9, 248, 2593}, {9, 249, 2625}, {9, 258, 2657},
{9, 259, 2689},
{10, 252, 8}, {10, 253, 9}, {10, 380, 37}, {10, 381, 99},
{10, 444, 194},
{10, 445, 226}, {10, 476, 258}, {10, 477, 290}, {10, 492, 577},
{10, 493, 609}, TABLE 8-continued MPEG4 RVLC INTER VLC table.

{10, 500, 641}, {10, 501, 2721}, {10, 504, 2753}, {10, 505, 2785},
{10, 514, 2817},
{10, 515, 2849}, {11, 508, 10}, {11, 509, 11}, {11, 764, 38},
{11, 765, 68},
{11, 892, 131}, {11, 893, 163}, {11, 956, 322}, {11, 957, 673},
{11, 988, 705},
{11, 989, 737}, {11, 1004, 769}, {11, 1005, 801}, {11, 1012, 833},
{11, 1013, 2051},
{11, 1016, 2114}, {11, 1017, 2881}, {11, 1026, 2913}, {11, 1027, 2945},
{12, 1020, 12},
{12, 1021, 39}, {12, 1532, 69}, {12, 1533, 100}, {12, 1788, 195},
{12, 1789, 227},
{12, 1916, 354}, {12, 1917, 865}, {12, 1980, 897}, {12, 1981, 929},
{12, 2012, 2083},
{12, 2013, 2146}, {12, 2028, 2178}, {12, 2029, 2977}, {12, 2036, 3009},
{12, 2037, 3041},
{12, 2040, 3073}, {12, 2041, 3105}, {12, 2050, 3137}, {12, 2051, 3169},
{13, 2044, 13},
{13, 2045, 14}, {13, 3068, 15}, {13, 3069, 16}, {13, 3580, 40},
{13, 3581, 101},
{13, 3836, 132}, {13, 3837, 164}, {13, 3964, 259}, {13, 3965, 386},
{13, 4028, 961},
{13, 4029, 993}, {13, 4060, 1025}, {13, 4061, 1057}, {13, 4076, 2052},
{13, 4077, 2210},
{13, 4084, 2242}, {13, 4085, 2274}, {13, 4088, 2306}, {13, 4089, 2338},
{13, 4098, 3201},
{13, 4099, 3233}, {14, 4092, 17}, {14, 4093, 18}, {14, 6140, 41},
{14, 6141, 42},
{14, 7164, 70}, {14, 7165, 71}, {14, 7676, 102}, {14, 7677, 196},
{14, 7932, 291},
{14, 7933, 418}, {14, 8060, 450}, {14, 8061, 482}, {14, 8124, 514},
{14, 8125, 1089},
{14, 8156, 1121}, {14, 8157, 1153}, {14, 8172, 2053}, {14, 8173, 2084},
{14, 8180, 2370},
{14, 8181, 2402}, {14, 8184, 2434}, {14, 8185, 3265}, {14, 8194, 3297},
{14, 8195, 3329},
{15, 8188, 19}, {15, 8189, 103}, {15, 12284, 133}, {15, 12285, 228},
{15, 14332, 546},
{15, 14333, 1185}, {15, 15356, 1217}, {15, 15357, 2085},
{15, 15868, 2115}, {15, 15869, 2466},
{15, 16124, 3361}, {15, 16125, 3393}, {15, 16252, 3425},
{15, 16253, 3457}, {5, 1, 88},
};

Each entry is (code length, code word, and code pattern) stored in decimal.

For this example, take pbits equal to 7 which turns out to be the prefix size minimizing VLD table memory requirements. This means the left-most 7 bits of each codeword define which prefix-oriented table will include that codeword; if a codeword has less than 7 bits, then it will correspond to a range of prefixes. For example, the left column of following Table 9 shows the original MPEG4 RVLC Table entries (length, pattern (in decimal), vlc_code (in binary)), the middle column shows the corresponding partitioning into prefix-oriented tables for pbits=7 with entries (length-pbits, pattern (in decimal), vlc_code & ($2^{length-pbits}-1$)), and the right column has the entries of the middle column reorganized within each prefix-oriented table. In particular, Table 9 shows illustrates the following possibilities: no entries for prefix in various ranges, such as 0000000, . . . , 0000011 (=0x00, . . . , 0x03 in hexadecimal); one entry for prefix in several ranges which arise when the codeword has less than pbits bits, such as prefix in the range 0x04–0x07 for codeword 00001; one entry for a single prefix, which arises for a codeword with exactly pbits bits, such as prefix=0x1C for codeword 0011100; and multiple entries for fourteen different prefix, such prefix=0x1E has two entries and prefix=0x1F has 14 entries. The codeword entries in the center column of Table 9 are in the format (length-pbits, pattern, prefix-stripped, left-shifted version of vlc_code in binary) and are listed in increasing order when interpreted as binary integers. After stripping off prefix, the maximum length of the codewords in a prefix-oriented table with entries in the center column is plen_max=len_max−pbits; for example, the prefix-oriented table with prefix=0x1E has two entries and plen_max=1 because after stripping off prefix, the two originally-8-bit codewords are now the two 1-bit codewords 0 and 1; similarly, the prefix-oriented table with prefix=0x1F has 14 entries and plen_max=8 because after stripping off prefix, the original codewords with lengths ranging from 9 to 15 bits now have 2 to 8 bits.

TABLE 9

The VLC Table in Table 8 decomposed into prefix-oriented tables

| Original VLC Table (MPEG4 INTER RVLC) | | | Prefix-Oriented Table (prefix, plen_max) | | | Prefix-Oriented Table after reorganization with mask key | | |
|---|---|---|---|---|---|---|---|---|
| | original table entries (N/A) | | (prefix = 0x0 - 0x3 N/A) | | | (N/A) | | |
| | original table entries | | (prefix = 0x4 plen_max = 0) | −0x7 | | (N/A) | | |
| 5 | 88 | 00001---------- | N/A | | | N/A | | |
| | original table entries | | (prefix = 0x8 plen_max = 0) | −0xf | | (N/A) | | |
| 4 | 2 | 0001---------- | N/A | | | N/A | | |
| | original table entries | | (prefix = 0x10 plen_max = 0) | −0x13 | | (N/A) | | |
| 5 | 3 | 00100---------- | N/A | | | N/A | | |
| | original table entries | | (prefix = 0x14 plen_max = 0) | −0x17 | | (N/A) | | |
| 5 | 97 | 00101---------- | N/A | | | N/A | | |
| | original table entries | | (prefix = 0x18 plen_max = 0) | −0x19 | | (N/A) | | |
| 6 | 34 | 001100--------- | N/A | | | N/A | | |
| | original table entries | | (prefix = 0x1a plen_max = 0) | −0x1b | | (N/A) | | |
| 6 | 193 | 001101--------- | N/A | | | N/A | | |
| | original table entries | | (prefix = 0x1c plen_max = 0) | −0x1c | | (N/A) | | |
| 7 | 4 | 0011100-------- | N/A | | | N/A | | |
| | original table entries | | (prefix = 0x1d plen_max = 0) | −0x1d | | (N/A) | | |
| 7 | 66 | 0011101-------- | N/A | | | N/A | | |
| | original table entries | | (prefix = 0x1e plen_max = 1) | | | (prefix = 0x1e plen_max = 1 mask_key = 0x0) | | |
| 8 | 5 | 00111100------- | 1 | 5 | 0 | 1 | 5 | 0 |
| 8 | 6 | 00111101------- | 1 | 6 | 1 | 1 | 6 | 1 |
| | original table entries | | (prefix = 0x1f plen_max = 8) | | | (prefix = 0x1f plen_max = 8 mask_key = 0xfc) | | |
| 9 | 7 | 001111100------ | 2 | 7 | 00------ | 8 | 19 | 00000000 |
| 9 | 36 | 001111101------ | 2 | 36 | 01------ | 8 | 103 | 00000001 |
| 10 | 8 | 0011111100----- | 3 | 8 | 100----- | 7 | 17 | 0000010- |
| 10 | 9 | 0011111101----- | 3 | 9 | 101----- | 7 | 18 | 0000011- |
| 11 | 10 | 00111111100---- | 4 | 10 | 1100---- | 6 | 14 | 000010-- |
| 11 | 11 | 00111111101---- | 4 | 11 | 1101---- | 6 | 13 | 000011-- |
| 12 | 12 | 001111111100--- | 5 | 12 | 11100--- | 5 | 39 | 00010--- |
| 12 | 39 | 001111111101--- | 5 | 39 | 11101--- | 5 | 12 | 00011--- |
| 13 | 13 | 0011111111100-- | 6 | 13 | 111100-- | 4 | 11 | 0010---- |
| 13 | 14 | 0011111111101-- | 6 | 14 | 111101-- | 4 | 10 | 0011---- |
| 14 | 17 | 00111111111100- | 7 | 17 | 1111100- | 3 | 9 | 010----- |
| 14 | 18 | 00111111111101- | 7 | 18 | 1111101- | 3 | 8 | 011----- |
| 15 | 19 | 001111111111100 | 8 | 19 | 11111100 | 2 | 36 | 10------ |
| 15 | 103 | 001111111111101 | 8 | 103 | 11111101 | 2 | 7 | 11------ |
| | original table entries | | (prefix = 0x20 plen_max = 0) | −0x23 | | (N/A) | | |
| 5 | 129 | 01000---------- | N/A | | | N/A | | |
| | original table entries | | (prefix = 0x24 plen_max = 0) | −0x27 | | (N/A) | | |
| 5 | 161 | 01001---------- | N/A | | | N/A | | |
| | original table entries | | (prefix = 0x28 plen_max = 0) | −0x29 | | (N/A) | | |
| 6 | 225 | 010100--------- | N/A | | | N/A | | |
| | original table entries | | (prefix = 0x2a plen_max = 0) | −0x2b | | (N/A) | | |
| 6 | 257 | 010101--------- | N/A | | | N/A | | |
| | original table entries | | (prefix = 0x2c plen_max = 0) | −0x2c | | (N/A) | | |
| 7 | 289 | 0101100-------- | N/A | | | N/A | | |
| | original table entries | | (prefix = 0x2d plen_max = 0) | −0x2d | | (N/A) | | |

TABLE 9-continued

The VLC Table in Table 8 decomposed into prefix-oriented tables

| | Original VLC Table (MPEG4 INTER RVLC) | | Prefix-Oriented Table (prefix, plen_max) | | | Prefix-Oriented Table after reorganization with mask key | | |
|---|---|---|---|---|---|---|---|---|
| 7 | 321 | 0101101-------- | N/A | | | N/A | | |
| | original table entries | | (prefix = 0x2e plen_max = 1) | | | (prefix = 0x2e plen_max = 1 mask_key = 0x0) | | |
| 8 | 35 | 01011100------- | 1 | 35 | 0 | 1 | 35 | 0 |
| 8 | 98 | 01011101------- | 1 | 98 | 1 | 1 | 98 | 1 |
| | original table entries | | (prefix = 0x2f plen_max = 8) | | | (prefix = 0x2f plen_max = 8 mask_key = 0xfc) | | |
| 9 | 67 | 010111100------ | 2 | 67 | 00------ | 8 | 133 | 00000000 |
| 9 | 162 | 010111101------ | 2 | 162 | 01------ | 8 | 228 | 00000001 |
| 10 | 37 | 0101111100----- | 3 | 37 | 100----- | 7 | 41 | 0000010- |
| 10 | 99 | 0101111101----- | 3 | 99 | 101----- | 7 | 42 | 0000011- |
| 11 | 38 | 01011111100---- | 4 | 38 | 1100---- | 6 | 16 | 000010-- |
| 11 | 68 | 01011111101---- | 4 | 68 | 1101---- | 6 | 15 | 000011-- |
| 12 | 69 | 010111111100--- | 5 | 69 | 11100--- | 5 | 100 | 00010--- |
| 12 | 100 | 010111111101--- | 5 | 100 | 11101--- | 5 | 69 | 00011--- |
| 13 | 15 | 0101111111100-- | 6 | 15 | 111100-- | 4 | 68 | 0010---- |
| 13 | 16 | 0101111111101-- | 6 | 16 | 111101-- | 4 | 38 | 0011---- |
| 14 | 41 | 01011111111100- | 7 | 41 | 1111100- | 3 | 99 | 010----- |
| 14 | 42 | 01011111111101- | 7 | 42 | 1111101- | 3 | 37 | 011----- |
| 15 | 133 | 010111111111100 | 8 | 133 | 11111100 | 2 | 162 | 10------ |
| 15 | 228 | 010111111111101 | 8 | 228 | 11111101 | 2 | 67 | 11------ |
| | original table entries | | (prefix = 0x30 –0x31 plen_max = 0) | | | (N/A) | | |
| 6 | 2145 | 011000--------- | N/A | | | N/A | | |
| | original table entries | | (prefix = 0x32 –0x33 plen_max = 0) | | | (N/A) | | |
| 6 | 2177 | 011001--------- | N/A | | | N/A | | |
| | original table entries | | (prefix = 0x34 –0x34 plen_max = 0) | | | (N/A) | | |
| 7 | 353 | 0110100-------- | N/A | | | N/A | | |
| | original table entries | | (prefix = 0x35 –0x35 plen_max = 0) | | | (N/A) | | |
| 7 | 2273 | 0110101-------- | N/A | | | N/A | | |
| | original table entries | | (prefix = 0x36 plen_max = 1) | | | (prefix = 0x36 plen_max = 1 mask_key = 0x0) | | |
| 8 | 130 | 01101100------- | 1 | 130 | 0 | 1 | 130 | 0 |
| 8 | 385 | 01101101------- | 1 | 385 | 1 | 1 | 385 | 1 |
| | original table entries | | (prefix = 0x37 plen_max = 8) | | | (prefix = 0x37 plen_max = 8 mask_key = 0xfc) | | |
| 9 | 481 | 011011100------ | 2 | 481 | 00------ | 8 | 546 | 00000000 |
| 9 | 513 | 011011101------ | 2 | 513 | 01------ | 8 | 1185 | 00000001 |
| 10 | 194 | 0110111100----- | 3 | 194 | 100----- | 7 | 70 | 0000010- |
| 10 | 226 | 0110111101----- | 3 | 226 | 101----- | 7 | 71 | 0000011- |
| 11 | 131 | 01101111100---- | 4 | 131 | 1100---- | 6 | 101 | 000010-- |
| 11 | 163 | 01101111101---- | 4 | 163 | 1101---- | 6 | 40 | 000011-- |
| 12 | 195 | 011011111100--- | 5 | 195 | 11100--- | 5 | 227 | 00010--- |
| 12 | 227 | 011011111101--- | 5 | 227 | 11101--- | 5 | 195 | 00011--- |
| 13 | 40 | 0110111111100-- | 6 | 40 | 111100-- | 4 | 163 | 0010---- |
| 13 | 101 | 0110111111101-- | 6 | 101 | 111101-- | 4 | 131 | 0011---- |
| 14 | 70 | 01101111111100- | 7 | 70 | 1111100- | 3 | 226 | 010----- |
| 14 | 71 | 01101111111101- | 7 | 71 | 1111101- | 3 | 194 | 011----- |
| 15 | 546 | 011011111111100 | 8 | 546 | 11111100 | 2 | 513 | 10------ |
| 15 | 1185 | 011011111111101 | 8 | 1185 | 11111101 | 2 | 481 | 11------ |
| | original table entries | | (prefix = 0x38 –0x38 plen_max = 0) | | | (N/A) | | |
| 7 | 2305 | 0111000-------- | N/A | | | N/A | | |
| | original table entries | | (prefix = 0x39 –0x39 plen_max = 0) | | | (N/A) | | |
| 7 | 2337 | 0111001-------- | N/A | | | N/A | | |
| | original table entries | | (prefix = 0x3a plen_max = 1) | | | (prefix = 0x3a plen_max = 1 mask_key = 0x0) | | |
| 8 | 417 | 01110100------- | 1 | 417 | 0 | 1 | 417 | 0 |
| 8 | 449 | 01110101------- | 1 | 449 | 1 | 1 | 449 | 1 |
| | original table entries | | (prefix = 0x3b plen_max = 8) | | | (prefix = 0x3b plen_max = 8 mask_key = 0xfc) | | |
| 9 | 545 | 011101100------ | 2 | 545 | 00------ | 8 | 1217 | 00000000 |
| 9 | 2082 | 011101101------ | 2 | 2082 | 01------ | 8 | 2085 | 00000001 |
| 10 | 258 | 0111011100----- | 3 | 258 | 100----- | 7 | 102 | 0000010- |
| 10 | 290 | 0111011101----- | 3 | 290 | 101----- | 7 | 196 | 0000011- |
| 11 | 322 | 01110111100---- | 4 | 322 | 1100---- | 6 | 164 | 000010-- |
| 11 | 673 | 01110111101---- | 4 | 673 | 1101---- | 6 | 132 | 000011-- |
| 12 | 354 | 011101111100--- | 5 | 354 | 11100--- | 5 | 865 | 00010--- |
| 12 | 865 | 011101111101--- | 5 | 865 | 11101--- | 5 | 354 | 00011--- |

TABLE 9-continued

The VLC Table in Table 8 decomposed into prefix-oriented tables

| Original VLC Table (MPEG4 INTER RVLC) | | | Prefix-Oriented Table (prefix, plen_max) | | | Prefix-Oriented Table after reorganization with mask key | | |
|---|---|---|---|---|---|---|---|---|
| 13 | 132 | 0111011111100-- | 6 | 132 | 111100-- | 4 | 673 | 0010---- |
| 13 | 164 | 0111011111101-- | 6 | 164 | 111101-- | 4 | 322 | 0011---- |
| 14 | 102 | 01110111111100- | 7 | 102 | 1111100- | 3 | 290 | 010----- |
| 14 | 196 | 01110111111101- | 7 | 196 | 1111101- | 3 | 258 | 011----- |
| 15 | 1217 | 011101111111100 | 8 | 1217 | 11111100 | 2 | 2082 | 10------ |
| 15 | 2085 | 011101111111101 | 8 | 2085 | 11111101 | 2 | 545 | 11------ |
| | original table entries | | (prefix = 0x3c plen_max = 1) | | | (prefix = 0x3c plen_max = 1 mask_key = 0x0) | | |
| 8 | 2050 | 01111000------- | 1 | 2050 | 0 | 1 | 2050 | 0 |
| 8 | 2433 | 01111001------- | 1 | 2433 | 1 | 1 | 2433 | 1 |
| | original table entries | | (prefix = 0x3d plen_max = 8) | | | (prefix = 0x3d plen_max = 8 mask_key = 0xfc) | | |
| 9 | 2529 | 011110100------ | 2 | 2529 | 00------ | 8 | 2115 | 00000000 |
| 9 | 2561 | 011110101------ | 2 | 2561 | 01------ | 8 | 2466 | 00000001 |
| 10 | 577 | 0111101100----- | 3 | 577 | 100----- | 7 | 291 | 0000010- |
| 10 | 609 | 0111101101----- | 3 | 609 | 101----- | 7 | 418 | 0000011- |
| 11 | 705 | 01111011100---- | 4 | 705 | 1100---- | 6 | 386 | 000010-- |
| 11 | 737 | 01111011101---- | 4 | 737 | 1101---- | 6 | 259 | 000011-- |
| 12 | 897 | 011110111100--- | 5 | 897 | 11100--- | 5 | 929 | 00010--- |
| 12 | 929 | 011110111101--- | 5 | 929 | 11101--- | 5 | 897 | 00011--- |
| 13 | 259 | 0111101111100-- | 6 | 259 | 111100-- | 4 | 737 | 0010---- |
| 13 | 386 | 0111101111101-- | 6 | 386 | 111101-- | 4 | 705 | 0011---- |
| 14 | 291 | 01111011111100- | 7 | 291 | 1111100- | 3 | 609 | 010----- |
| 14 | 418 | 01111011111101- | 7 | 418 | 1111101- | 3 | 577 | 011----- |
| 15 | 2115 | 011110111111100 | 8 | 2115 | 11111100 | 2 | 2561 | 10------ |
| 15 | 2466 | 011110111111101 | 8 | 2466 | 11111101 | 2 | 2529 | 11------ |
| | original table entries | | (prefix = 0x3e plen_max = 8) | | | (prefix = 0x3e plen_max = 8 mask_key = 0xfc) | | |
| 9 | 2593 | 011111000------ | 2 | 2593 | 00------ | 8 | 3361 | 00000000 |
| 9 | 2625 | 011111001------ | 2 | 2625 | 01------ | 8 | 3393 | 00000001 |
| 10 | 641 | 0111110100----- | 3 | 641 | 100----- | 7 | 450 | 0000010- |
| 10 | 2721 | 0111110101----- | 3 | 2721 | 101----- | 7 | 482 | 0000011- |
| 11 | 769 | 01111101100---- | 4 | 769 | 1100---- | 6 | 993 | 000010-- |
| 11 | 801 | 01111101101---- | 4 | 801 | 1101---- | 6 | 961 | 000011-- |
| 12 | 2083 | 011111011100--- | 5 | 2083 | 11100--- | 5 | 2146 | 00010--- |
| 12 | 2146 | 011111011101--- | 5 | 2146 | 11101--- | 5 | 2083 | 00011--- |
| 13 | 961 | 0111110111100-- | 6 | 961 | 111100-- | 4 | 801 | 0010---- |
| 13 | 993 | 0111110111101-- | 6 | 993 | 111101-- | 4 | 769 | 0011---- |
| 14 | 450 | 01111101111100- | 7 | 450 | 1111100- | 3 | 2721 | 010----- |
| 14 | 482 | 01111101111101- | 7 | 482 | 1111101- | 3 | 641 | 011----- |
| 15 | 3361 | 011111011111100 | 8 | 3361 | 11111100 | 2 | 2625 | 10------ |
| 15 | 3393 | 011111011111101 | 8 | 3393 | 11111101 | 2 | 2593 | 11------ |
| | original table entries | | (prefix = 0x3f plen_max = 8) | | | (prefix = 0x3f plen_max = 8 mask_key = 0x7c) | | |
| 10 | 2753 | 0111111000----- | 3 | 2753 | 000----- | 8 | 3425 | 00000000 |
| 10 | 2785 | 0111111001----- | 3 | 2785 | 001----- | 8 | 3457 | 00000001 |
| 11 | 833 | 01111110100---- | 4 | 833 | 0100---- | 7 | 514 | 0000010- |
| 11 | 2051 | 01111110101---- | 4 | 2051 | 0101---- | 7 | 1089 | 0000011- |
| 12 | 2178 | 011111101100--- | 5 | 2178 | 01100--- | 6 | 1057 | 000010-- |
| 12 | 2977 | 011111101101--- | 5 | 2977 | 01101--- | 6 | 1025 | 000011-- |
| 13 | 1025 | 0111111011100-- | 6 | 1025 | 011100-- | 5 | 2977 | 00010--- |
| 13 | 1057 | 0111111011101-- | 6 | 1057 | 011101-- | 5 | 2178 | 00011--- |
| 14 | 514 | 01111110111100- | 7 | 514 | 0111100- | 4 | 2051 | 0010---- |
| 14 | 1089 | 01111110111101- | 7 | 1089 | 0111101- | 4 | 833 | 0011---- |
| 15 | 3425 | 011111101111100 | 8 | 3425 | 01111100 | 3 | 2785 | 010----- |
| 15 | 3457 | 011111101111101 | 8 | 3457 | 01111101 | 3 | 2753 | 011----- |
| 11 | 2114 | 01111111000---- | 4 | 2114 | 1000---- | 7 | 2434 | 1000110- |
| 11 | 2881 | 01111111001---- | 4 | 2881 | 1001---- | 7 | 3265 | 1000111- |
| 12 | 3009 | 011111110100--- | 5 | 3009 | 10100--- | 7 | 2370 | 1001010- |
| 12 | 3041 | 011111110101--- | 5 | 3041 | 10101--- | 7 | 2402 | 1001011- |
| 13 | 2052 | 0111111101100-- | 6 | 2052 | 101100-- | 6 | 2338 | 100110-- |
| 13 | 2210 | 0111111101101-- | 6 | 2210 | 101101-- | 6 | 2306 | 100111-- |
| 14 | 1121 | 01111111011100- | 7 | 1121 | 1011100- | 7 | 2053 | 1010010- |
| 14 | 1153 | 01111111011101- | 7 | 1153 | 1011101- | 7 | 2084 | 1010011- |
| 12 | 3073 | 011111111000--- | 5 | 3073 | 11000--- | 6 | 2274 | 101010-- |
| 12 | 3105 | 011111111001--- | 5 | 3105 | 11001--- | 6 | 2242 | 101011-- |
| 13 | 2242 | 0111111110100-- | 6 | 2242 | 110100-- | 5 | 3105 | 10110--- |
| 13 | 2274 | 0111111110101-- | 6 | 2274 | 110101-- | 5 | 3073 | 10111--- |
| 14 | 2053 | 01111111101100- | 7 | 2053 | 1101100- | 7 | 1121 | 1100010- |
| 14 | 2084 | 01111111101101- | 7 | 2084 | 1101101- | 7 | 1153 | 1100011- |
| 13 | 2306 | 0111111111000-- | 6 | 2306 | 111000-- | 6 | 2210 | 110010-- |
| 13 | 2338 | 0111111111001-- | 6 | 2338 | 111001-- | 6 | 2052 | 110011-- |
| 14 | 2370 | 01111111110100- | 7 | 2370 | 1110100- | 5 | 3041 | 11010--- |

TABLE 9-continued

The VLC Table in Table 8 decomposed into prefix-oriented tables

| Original VLC Table (MPEG4 INTER RVLC) | | | Prefix-Oriented Table (prefix, plen_max) | | | Prefix-Oriented Table after reorganization with mask key | | |
|---|---|---|---|---|---|---|---|---|
| 14 | 2402 | 01111111110101- | 7 | 2402 | 1110101- | 5 | 3009 | 11011--- |
| 14 | 2434 | 01111111111000- | 7 | 2434 | 1111000- | 4 | 2881 | 1110---- |
| 14 | 3265 | 01111111111001- | 7 | 3265 | 1111001- | 4 | 2114 | 1111---- |
| | original table entries | | (prefix = 0x40 plen_max = 7) | | | (prefix = 0x40 plen_max = 7 mask_key = 0x2) | | |
| 14 | 3297 | 10000000000010- | 7 | 3297 | 0000010 | 7 | 3297 | 0000000 |
| 14 | 3329 | 10000000000011- | 7 | 3329 | 0000011 | 7 | 3329 | 0000001 |
| 13 | 3201 | 1000000000010-- | 6 | 3201 | 000010- | 6 | 3233 | 000010- |
| 13 | 3233 | 1000000000011-- | 6 | 3233 | 000011- | 6 | 3201 | 000011- |
| 12 | 3137 | 100000000010--- | 5 | 3137 | 00010-- | 5 | 3137 | 00010-- |
| 12 | 3169 | 100000000011--- | 5 | 3169 | 00011-- | 5 | 3169 | 00011-- |
| 11 | 2913 | 10000000010---- | 4 | 2913 | 0010--- | 4 | 2913 | 0010--- |
| 11 | 2945 | 10000000011---- | 4 | 2945 | 0011--- | 4 | 2945 | 0011--- |
| 10 | 2817 | 1000000010----- | 3 | 2817 | 010---- | 3 | 2817 | 010---- |
| 10 | 2849 | 1000000011----- | 3 | 2849 | 011---- | 3 | 2849 | 011---- |
| 9 | 2657 | 100000010------ | 2 | 2657 | 10----- | 2 | 2657 | 10----- |
| 9 | 2689 | 100000011------ | 2 | 2689 | 11----- | 2 | 2689 | 11----- |
| | original table entries | | (prefix = 0x41 plen_max = 1) | | | (prefix = 0x41 plen_max = 1 mask_key = 0x0) | | |
| 8 | 2465 | 10000010------- | 1 | 2465 | 0 | 1 | 2465 | 0 |
| 8 | 2497 | 10000011------- | 1 | 2497 | 1 | 1 | 2497 | 1 |
| | original table entries | | (prefix = 0x42 –0x42 plen_max = 0) | | | (N/A) | | |
| 7 | 2369 | 1000010-------- | N/A | | | N/A | | |
| | original table entries | | (prefix = 0x43 –0x43 plen_max = 0) | | | (N/A) | | |
| 7 | 2401 | 1000011-------- | N/A | | | N/A | | |
| | original table entries | | (prefix = 0x44 –0x45 plen_max = 0) | | | (N/A) | | |
| 6 | 2209 | 100010--------- | N/A | | | N/A | | |
| | original table entries | | (prefix = 0x46 –0x47 plen_max = 0) | | | (N/A) | | |
| 6 | 2241 | 100011--------- | N/A | | | N/A | | |
| | original table entries | | (prefix = 0x48 –0x4b plen_max = 0) | | | (N/A) | | |
| 5 | 2081 | 10010---------- | N/A | | | N/A | | |
| | original table entries | | (prefix = 0x4c –0x4f plen_max = 0) | | | (N/A) | | |
| 5 | 2113 | 10011---------- | N/A | | | N/A | | |
| | original table entries | | (prefix = 0x50 –0x57 plen_max = 0) | | | (N/A) | | |
| 4 | 65 | 1010----------- | N/A | | | N/A | | |
| | original table entries | | (prefix = 0x58 –0x5f plen_max = 0) | | | (N/A) | | |
| 4 | 2049 | 1011----------- | N/A | | | N/A | | |
| | original table entries | | (prefix = 0x60 –0x6f plen_max = 0) | | | (N/A) | | |
| 3 | 1 | 110------------ | N/A | | | N/A | | |
| | original table entries | | (prefix = 0x70 –0x7f plen_max = 0) | | | (N/A) | | |
| 3 | 33 | 111------------ | N/A | | | N/A | | |

Note that one effect of partitioning into prefix-oriented tables and then into sub-tables for the AUVLD control table and code table construction as compared to a direct VLD control table and code table construction is the decrease in the number of repetitions in the code table due to a smaller range of codeword lengths in the sub-tables. For example, dividing Table 8 directly into sub-tables would mean that all codewords beginning with 01 would be in the same sub-table and these codewords vary in length from 5 bits to 15 bits. In contrast, in the prefix-oriented tables with prefixes= 01xxxxx, the prefix-stripped codewords varying in length from 2 bits to 8 bits in five of the prefix-oriented tables and from 4 bits to 8 bits in the largest prefix-oriented table which has prefix 0111111; see Table 9.

Next, for each prefix-oriented table shown in the center column of Table 9, consider all possible bit masks, mask_key, of plen_max bits, and XOR (bit-by-bit) the left-shifted, prefix-stripped codewords with such mask_key. Then reorganize the XORed prefix-oriented table with increasing order by interpreting as binary integers; see the third column of Table 9. For example, the prefix-oriented table for prefix= 0x1F has plen_max=8, and thus with 8-bit mask_key= 0xFC (=1111 1100) the prefix-stripped, left-shifted codewords have their first 6 bits reversed by the XORing. These XORed codewords are reorganized as illustrated in the right column of Table 9 which shows the entry 8 19 11111100 of the center column becoming entry 8 19 00000000 of the right column and thus moving in the ordering from second largest in the center column to smallest in the right column. Each possible 8-bit mask_key is used, and the one yielding the smallest memory requirements for the resulting control and code tables (next paragraph) will be selected. Very roughly, the mask_key which makes the longest codewords in the prefix-oriented table have the most leading 0s will minimize memory requirements when using the 0-leading construction of VLD control and code tables of the foregoing sections. Indeed, the reverse used for 1-leading codes in the foregoing to convert them to 0-leading codes is the special case of taking mask_key=111 . . . 11. The pair (plen_max, mask_key) is the entry in AUVLD prefix table (VLDPrefixTab in FIG. 1b) corresponding to prefix; this prefix table has $2^{pbits}$ entries.

For a prefix-oriented table with none or only one entry (so plen_max=0), construct the corresponding AUVLD control table with only one entry. Of course, when plen_max=0, the first bits of prefix are the codeword.

For each prefix-oriented table with multiple entries (XORed prefix-stripped, left-shifted codewords), construct a control table plus a code table in the same manner as described for the 0-leading construction of the UVLD code table and UVLD control table in the foregoing sections. The overall AUVLD control table is two-dimensional in the sense that the subtables of the AUVLD code table are indexed by both prefix and subtab_id, the same subtable index as in a UVLD control table. However, following section 6 will merge the prefix table into the control table to reduce memory, and Table 12 shows the ultimate VLD code table and VLD control table for Table 8.

5. Advanced Universal VLD Decoding

As illustrated in FIG. 1b, AUVLD decodes using the tables constructed in the foregoing section (the prefix table VLDPrefixTab[.], the two-dimensional VLD control table VLDCtlTab[.][.], and the VLD code table VLDCodeTab[.]) including the corresponding parameters len_max and pbits. Indeed, given the following data types:

```
typedef struct vldcodetab{
    char        length;
    short       pattern
} VLDCodeTab;
typedef struct vldctltab{
    char        shift;
    short       offset;
} VLDCtlTab;
typedef struct vldprefixtab{
    char        plen_max;
    int         mask_key;
} VLDPrefixTab;
``` then AUVLD decodes as follows:

1. Get prefix for the next codeword (which encodes the next symbol) from the first pbits of the bitstream starting at the current decoding position.
2. Obtain the maximum code length (plen_max) and mask (mask_key) for the prefix-oriented table corresponding to prefix by look up in the VLD prefix table:

plen_max=VLDPrefixTab[prefix].plen_max;

mask_key=VLDPrefixTab[prefix].mask_key;

3. Get value, the next plen_max bits (following the pbits bits already read) from the bitstream; note that plen_max may be 0.
4. Perform XOR with the mask key from step 2: value=XOR(value, mask_key) where mask_key was found in step 2 as part of the look up.
5. Use the XORed value from step 4 to determine the sub-table index, subtab_id, for addressing the VLD control table: if value is 0 (e.g., plen_max=0), then subtab_id=0; else subtab_id=(int) $\log_2$(value)+1.
6. Get shift and offset from the (two-dimensional) VLD control table; prefix is the first index and subtab_id the second. In FIG. 1b prefix controls SWITCH to set VLD control table first index.

shift=VLDCtlTab[prefix][subtab_id].shift;

offset=VLDCtlTab[prefix][subtab_id].offset;

7. Compute the index to use in the VLD code table from shift and offset: index=(value>>shift)+offset; this is the same as with UVLD.

index=(value >>shift)+offset;

8. Use index to look up length and pattern in the VLD code table; this is the same as with UVLD.

length=VLDCodeTab[index].length;

pattern=VLDCodeTab[index].pattern;

9. Set the next decoder position by moving the current decoding position by length bits; and interpret pattern to decode the symbol; again the same as with UVLD.
10. Loop back to step 1 for decoding the next symbol. Note that errors are detected when the bits read do not correspond to a codeword and thus do not lead to an entry in the VLD code table.

The following table 10 shows pseudocode for the decoding of FIG. 1b.

TABLE 10 pseudocode for the AUVLD of FIG. 1b

```
int AdvancedUniversalVLD(
    Bitstream *stream,           /* pointer of bitstream */
    VLDCodeTab *vldtab,          /* pointer of VLD code table */
    VLDCtlTab **vldctl,          /* pointer of VLD control table */
    int len_max,                 /* maximum code length in the VLC table */
    int pbits,                   /* number of prefix bits */
    VLDPrefixTab *vldprefixtab,  / * pointer of VLD prefix table */
    char *err_flag)              /* err_flag =1 ->error detected, err_flag=0->decoding OK */
{
    int value, subtab_id, index;
    int prefix, mask_key, plen_max;
    /*==========================================================
```

TABLE 10-continued pseudocode for the AUVLD of FIG. 1b

```
=*/
    /* get the value of next "len_max" bits in the bitstream
    */
    /*========================================================================
=*/
    value = next_bits(stream, len_max);
/*=========================================================================*/
    /* get the value of prefix
    */
    /*========================================================================
=*/
    prefix = value>>(len_max-pbits);
    /*========================================================================
=*/
    /* get maximum code length and mask key of prefix-oriented table
    */
    /*========================================================================
=*/
    plen_max = vldprefixtab[prefix].plen_max;
    mask_key = vldprefixtab[prefix].mask_key;
/*=========================================================================*/
    /* get the value of next "plen_max" bits
    */
    /*========================================================================
=*/
    value = (value>>(len_max-pbits-plen_max)) & ((1<<plen_max)-1);
/*=========================================================================*/
    /* Perform XOR opertaion
    */
    /*========================================================================
=*/
    value = value^mask_key
    /*========================================================================
=*/
    /* determine the sub-table index according to the value. TMS320C6X and TMS320C54X have
    */
    /* special instructions for such an operation
    */
    /*========================================================================
=*/
    if (value==0) subtab_id = 0; else subtab_id = (int) log2(value) + 1;
    /*========================================================================
=*/
    /* get index in the VLD code table
    */
    /*========================================================================
=*/
    index = vldctl[prefix][subtab_id].offset + (value>>vldctl[prefix][subtab_id].shift);
    /*========================================================================
=*/
    /* decide if an decoding error is detected
    */
    /*========================================================================
=*/
    if (vldtab[index].length ==0) *err_flag =1; else *err_flg=0;
    /*========================================================================
=*/
    /* update the current decoding position in the bitstream
    */
    /*========================================================================
=*/
    if (*err_flg==0) flush_bits(stream, vldtab[index].length);
    /*========================================================================
=*/
    /* return the decoded coding pattern
    */
    /*========================================================================
=*/
    return vldtab[index].pattern;
}
```

6. AUVLD efficient table storage

The AUVLD of the preceding sections shares the same table construction as the UVLD; the only difference is the UVLD table is stored in a more efficient way. According, a variation of AUVLD provides a more efficient storage using a another table format as follows. First, note that the prefix table has $2^{pbits}$ entries and that each entry could be 5 bytes: 1 byte for plen_max and 4 bytes for the mask_key. But the majority of prefix-oriented tables have none or only one entry and do not use or need mask_key stored. In the Table 9 MPEG4 RVLC example, only 14 of the 128 prefixes have a prefix-oriented table with multiple entries. And storing the control table as a two-dimensional array wastes memory in that the number of entries is the product of $2^{pbits}$ times max{plen_max$_j$+1} over j=0, 1, . . . , $2^{pbits}$-1. Thus, a prefix-oriented table with only one entry has to maintain 9 entries to make the two-dimensional control table addressing (prefix, subtab_id) possible. The two-dimensional control table in this case will have a total of 128×9 entries, most of the entries are dummy entries. Therefore, second preferred embodiments AUVLD combine the prefix table and the two-dimensional control table into a one-dimensional control table, VLDCtlTab[.] as illustrated in FIG. 1c. The VLD code table remains unchanged, and the combination of the prefix and control tables is as follows.

1. combine each entry (shift, offset) of the control table of each prefix-oriented table into a 16-bit word, with 5-bit shift followed by 11-bit offset.
2. embed mask_key of each prefix-oriented table into its control table VLDCtlTab by applying the following rules where VLDCtlTab is the VLD control table, plen_max and mask_key are the maximum code length and mask key for the prefix-oriented table, and len_max is the maximum code length for the VLC table:
   a) if plen_max=0, then no mask_key is embedded;
   b) if plen_max>0 and len_max≦16, then put mask_key in VLDCtlTab[-1];
   c) if plen_max>0 and len_max>16, then put (mask_key>>16) in VLDCtlTab[-2] and (mask_key&0xFFFF) in VLDCtlTab[-1]
3. cascade the individual VLD control tables (with mask_key embedded) together into a lined-up one-dimensional VLD control table, in the order of increasing prefix value. Dummy VLD control table entries are eliminated in this step.
4. place $2^{pbits}$ 16-bit entries in front of the lined-up one-dimensional VLD control table to make up a combined VLD control table; see FIG. 1c. These first $2^{pbits}$ 16-bit entries are addressed by prefix. Each of these entries is a doublet (plen_max, ptab_id) where plen_max is the maximum code length within the a prefix-oriented table and ptab_id points to the start index of the VLD control table of a prefix-oriented table in the combined one-dimensional control table; see FIG. 1c. The entry (plen_max, ptab_id) is combined into 16 bits by allocation of 5 bits for plen_max followed by 11 bits for ptab_id.
5. Combine each entry (length, pattern) in the VLD code table into 16 bits with (16-symbol_bits)-bit length followed by (symbol_bits)-bit pattern where symbol_bits is the number of bits used in storing pattern.

The alternative embodiment AUVLD decoder uses these two tables together with the parameters len_max, pbits, and symbol_bits for decoding. Note that all possible tables corresponding to combinations values of pbits and the various mask_keys are computed, and the values leading to the smallest memory required are selected. Of course, the universal decoding would also work for the tables derived for other values of pbits and the various mask_keys; only the proper table format is needed for this particular AUVLD.

7. AUVLD Decoding With Efficient Storage

As illustrated in FIG. 1c, with the preceding section efficient storage of merged prefix and control tables, AUVLD decodes using the VLD control table, VLD code table, and parameters len_max, pbits, and symbol_bits as follows:

1. Get prefix for the next codeword by reading the first pbits from the bitstream starting from the current decoding position.
2. Obtain the maximum code length (plen_max) and prefix-oriented table index (ptab_id) for the prefix-oriented table corresponding to prefix by look up in the one-dimensional control table using plen_max= VLDCtlTab[prefix]>>11 (the first 5 bits of the table entry) and ptab_id=VLDCtlTab[prefix]&0x7FF (the last 11 bits).
3. Get mask_key by if plen_max>0 and len_max≦16, then mask_key= VLDCtlTab[ptab_id-1]

if _max>0 and len_max>16, then mask_key= (VLDCtlTab[ptab_id-2]<<16)+VLDCtlTab[ptab_id-1]
4. Get, value, the next plen_max bits (following the pbits bits already read) from the bitstream; note that plen_max may be 0.
5. Perform XOR: value=XOR(value, maskkey) where maskkey was found in step 3 look up.
6. Use value from step 5 to determine the sub-table index, subtab_id, for addressing the VLD control table: if value is 0 (e.g., plen_max=0), then subtab_id=0; else subtab_id=(int) log$_2$(value)+1.
7. Get shift and offset from the (one-dimensional) VLD control table by shift=VLDCtlTab[ptab_id+subtab_id]>>11 (first 5 bits of entry) and offset=VLDCtlTab[ptab_id+subtab_id]&0x7FF (last 11 bits)
8. Compute the index in the VLD code table from shift and offset: index=(value>>shift)+offset; this is the same as with UVLD.
9. Use index to look up length and pattern for the current encoded symbol in the VLD code table by length= VLDCodeTab[index]>>symbolbits (first bits of entry) and pattern=VLDCodeTab[index]&$2^{symbol\_bits}$-1 (last bits)
10. Set the next decoder position by moving the current decoding position by length bits; and interpret pattern to get the decoded symbol; again the same as with UVLD.
11. Loop to step 1 for the next symbol decoding. Following Table 11 shows pseudocode for the decoding of FIG. 1c, and Table 12 shows the corresponding VLD code table and VLD control table constructed from Table 8. Note that the VLD code table has 295 entries and the VLD control table has 256 entries where each entry is one 2-byte word; whereas, the original MPEG-4 RVLC table has 170 entries with each entry (length, pattern, vlc_code). Thus the preferred embodiment conversion to universal decoding format does not greatly expand the VLC table.

TABLE 11 pseudocode for the AUVLD of FIG. 1c

```
int AdvancedUniversalVLD(
    Bitstream *stream,            /* pointer of bitstream
*/
    Unsigned short *vldtab,       /* pointer of VLD code table
*/
    Unigned short *vldctl,        /* pointer of VLD control table
*/
    int len_max,                  /* maximum code length in the VLD table
*/
    int pbits,                    /* number of prefix bits
*/
    int symbol_bits,              /* number of bits used for saving pattern in VLD code table entry
*/
    char *err_flag)               /* err_flag =1 ->error detected, err_flag=0->decoding OK
*/
{
    int value, subtab_id, index;
    int prefix, mask_key, plen_max;
    /*======================================================================
=*/
    /* get the value of next "len_max" bits in the bitstream
    */
    /*======================================================================
=*/
    value = next_bits(stream, len_max);
/*======================================================================*/
    /* get the value of prefix
*/
    /*======================================================================
=*/
    prefix = value>>(len_max-pbits);
    /*======================================================================
=*/
    /* get maximum code length and mask key of prefix-oriented table
    */
    /*======================================================================
=*/
    plen_max = vldctl[prefix]>>11;
    ptab_id = vldctl[prefix]&0x7ff;
    if (len_max ≦16 && plen_max >0) mask_key = vldctl[ptab_id-1];
        else If (len_max > 16 && plen_max >0)
            mask_key = (vldctltab [ptab_id-2]<<16) + vldctl[ptab_id-1];
                else mask_key = 0;
/*======================================================================*/
    /* get the value of next "plen_max" bits
*/
    /*======================================================================
=*/
    value =(value>>(len_max-pbits-plen_max)) & ((1<<plen_max)-1);
/*======================================================================*/
    /* Perform XOR operation
    */
    /*======================================================================
=*/
    value = value^mask_key
    /*======================================================================
=*/
    /* determine the sub-table index according to the value. TMS320C6X and TMS320C54X have
*/
    /* special instructions for such an operation
    */
    /*======================================================================
=*/
    if (value= =0) subtab_id = 0; else subtab_id = (int) log2(value) + 1;
    /*======================================================================
=*/
    /* get index in the VLD code table
    */
    /*======================================================================
=*/
    index = vldctl[ptab_id+subtab_id]&0x7ff + (value>> (vldctl[ptab_id+subtab_id]>>11));
    /*======================================================================
=*/
    /* decide if an decoding error is detected
    */
    /*======================================================================
=*/
```

TABLE 11-continued pseudocode for the AUVLD of FIG. 1c

```
    if ((vldtab[index]>>symbol_bits) = =0) *err_flag =1; else *err_flg=0;
    /*========================================================================
=*/
    /* update the current decoding position in the bitstream
    */
    /*========================================================================
=*/
    if (*err_flg= =0) flush_bits(stream, vldtab[index]>>symbol_bits));
    /*========================================================================
=*/
    /* return the decoded coding pattern
    */
    /*========================================================================
=*/
    return vldtab[index]&(2^{symbol\_bits}-1);
}
```

TABLE 12

VLD Code table and control table
for MPEG4 INTER RVLC Table 8

```
/* 4 bit len + 12 bit pattern (symbol_bits=12),
MPEG4_RVLC_INTER */
static unsigned short
MPEG4_RVLC_INTER_dcdtab[295]={
0x0000, 0x5058, 0x5058, 0x5058, 0x5058, 0x4002, 0x4002, 0x4002,
0x4002, 0x4002, 0x4002, 0x4002, 0x4002, 0x5003, 0x5003, 0x5003,
0x5003, 0x5061, 0x5061, 0x5061, 0x5061, 0x6022, 0x6022, 0x60c1,
0x60c1, 0x7004, 0x7042, 0x8005, 0x8006, 0xf013, 0xf067, 0xe011,
0xe012, 0xd00e, 0xd00d, 0xc027, 0xc00c, 0xb00b, 0xb00a, 0xa009,
0xa008, 0x9024, 0x9007, 0x5081, 0x5081, 0x5081, 0x5081, 0x50a1,
0x50a1, 0x50a1, 0x50a1, 0x60e1, 0x60e1, 0x6101, 0x6101, 0x7121,
0x7141, 0x8023, 0x8062, 0xf085, 0xf0e4, 0xe029, 0xe02a, 0xd010,
0xd00f, 0xc064, 0xc045, 0xb044, 0xb026, 0xa063, 0xa025, 0x90a2,
0x9043, 0x6861, 0x6861, 0x6881, 0x6881, 0x7161, 0x78e1, 0x8082,
0x8181, 0xf222, 0xf4a1, 0xe046, 0xe047, 0xd065, 0xd028, 0xc0e3,
0xc0c3, 0xb0a3, 0xb083, 0xa0e2, 0xa0c2, 0x9201, 0x91e1, 0x7901,
0x7921, 0x81a1, 0x81c1, 0xf4c1, 0xf825, 0xe066, 0xe0c4, 0xd0a4,
0xd084, 0xc361, 0xc162, 0xb2a1, 0xb142, 0xa122, 0xa102, 0x9822,
0x9221, 0x8802, 0x8981, 0xf843, 0xf9a2, 0xe123, 0xe1a2, 0xd182,
0xd103, 0xc3a1, 0xc381, 0xb2e1, 0xb2c1, 0xa261, 0xa241, 0x9a01,
0x99e1, 0xfd21, 0xfd41, 0xe1c2, 0xe1e2, 0xd3e1, 0xd3c1, 0xc862,
0xc823, 0xb321, 0xb301, 0xaaa1, 0xa281, 0x9a41, 0x9a21, 0xfd61,
0xfd81, 0xe202, 0xe441, 0xd421, 0xd401, 0xcba1, 0xc882, 0xb803,
0xb341, 0xaae1, 0xaac1, 0x0000, 0x0000, 0x0000, 0x0000, 0x0000,
0x0000, 0xe982, 0xecc1, 0x0000, 0x0000, 0xe942, 0xe962, 0xd922,
0xd922, 0xd902, 0xd902, 0x0000, 0x0000, 0xe805, 0xe824, 0xd8e2,
0xd8e2, 0xd8c2, 0xd8c2, 0xcc21, 0xcc21, 0xcc21, 0xcc21, 0xcc01,
0xcc01, 0xcc01, 0xcc01, 0x0000, 0x0000, 0xe461, 0xe481, 0xd8a2,
0xd8a2, 0xd804, 0xd804, 0xcbe1, 0xcbe1, 0xcbe1, 0xcbe1, 0xcbc1,
0xcbc1, 0xcbc1, 0xcbc1, 0xbb41, 0xbb41, 0xbb41, 0xbb41, 0xbb41,
0xbb41, 0xbb41, 0xbb41, 0xb842, 0xb842, 0xb842, 0xb842, 0xb842,
0xb842, 0xb842, 0xb842, 0xece1, 0xed01, 0xdca1, 0xdcc51, 0xcc41,
0xcc61, 0xbb61, 0xbb81, 0xab01, 0xab21, 0x9a61, 0x9a81, 0x89a1,
0x89c1, 0x7941, 0x7961, 0x68a1, 0x68a1, 0x68c1, 0x68c1, 0x5821,
0x5821, 0x5821, 0x5821, 0x5841, 0x5841, 0x5841, 0x5841, 0x4041,
0x4041, 0x4041, 0x4041, 0x4041, 0x4041, 0x4041, 0x4041, 0x4801,
0x4801, 0x4801, 0x4801, 0x4801, 0x4801, 0x4801, 0x4801, 0x3001,
0x3001, 0x3001, 0x3001, 0x3001, 0x3001, 0x3001, 0x3001, 0x3001,
0x3001, 0x3001, 0x3001, 0x3001, 0x3001, 0x3001, 0x3001, 0x3021,
0x3021, 0x3021, 0x3021, 0x3021, 0x3021, 0x3021, 0x3021, 0x3021,
0x3021, 0x3021, 0x3021, 0x3021, 0x3021, 0x3021, 0x3021,
};
/* prefix_bits = 7, len_max = 15 */
/* 5 bit SHIFT + 11 bit OFFSET */
static unsigned short
 MPEG4_RVLC_dcdctl[256]={
0x0080, 0x0080, 0x0080, 0x0080, 0x0081, 0x0081, 0x0081, 0x0081,
0x0082, 0x0082, 0x0082, 0x0082, 0x0082, 0x0082, 0x0082, 0x0082,
0x0083, 0x0083, 0x0083, 0x0083, 0x0084, 0x0084, 0x0084, 0x0084,
0x0085, 0x0085, 0x0086, 0x0086, 0x0087, 0x0088, 0x088a, 0x408d,
0x0096, 0x0096, 0x0096, 0x0096, 0x0097, 0x0097, 0x0097, 0x0097,
```

TABLE 12-continued

VLD Code table and control table
for MPEG4 INTER RVLC Table 8

```
0x0098, 0x0098, 0x0099, 0x0099, 0x009a, 0x009b, 0x089d, 0x40a0,
0x00a9, 0x00a9, 0x00aa, 0x00aa, 0x00ab, 0x00ac, 0x08ae, 0x40b1,
0x00ba, 0x00bb, 0x08bd, 0x40c0, 0x08ca, 0x40cd, 0x40d7, 0x40e1,
0x38eb, 0x08f4, 0x00f6, 0x00f7, 0x00f8, 0x00f8, 0x00f9, 0x00f9,
0x00fa, 0x00fa, 0x00fa, 0x00fa, 0x00fb, 0x00fb, 0x00fb, 0x00fb,
0x00fc, 0x00fc, 0x00fc, 0x00fc, 0x00fc, 0x00fc, 0x00fc, 0x00fc,
0x00fd, 0x00fd, 0x00fd, 0x00fd, 0x00fd, 0x00fd, 0x00fd, 0x00fd,
0x00fe, 0x00fe, 0x00fe, 0x00fe, 0x00fe, 0x00fe, 0x00fe, 0x00fe,
0x00fe, 0x00fe, 0x00fe, 0x00fe, 0x00fe, 0x00fe, 0x00fe, 0x00fe,
0x00ff, 0x00ff, 0x00ff, 0x00ff, 0x00ff, 0x00ff, 0x00ff, 0x00ff,
0x00ff, 0x00ff, 0x00ff, 0x00ff, 0x00ff, 0x00ff, 0x00ff, 0x00ff,
0x0000, 0x0001, 0x0005, 0x000d, 0x0011, 0x0015, 0x0017, 0x0019,
0x001a, 0x0000, 0x001b, 0x001b, 0x00fc, 0x001d, 0x001d, 0x401f,
0x081d, 0x101f, 0x1821, 0x2023, 0x2825, 0x3027, 0x002b, 0x002f,
0x0033, 0x0035, 0x0037, 0x0038, 0x0000, 0x0039, 0x0039, 0x00fc,
0x003b, 0x003b, 0x403d, 0x083b, 0x103d, 0x183f, 0x2041, 0x2843,
0x3045, 0x0049, 0x004b, 0x004d, 0x004e, 0x0000, 0x004f, 0x004f,
0x00fc, 0x0051, 0x0051, 0x4053, 0x0851, 0x1053, 0x1855, 0x2057,
0x2859, 0x305b, 0x005f, 0x0060, 0x0000, 0x0061, 0x0000fc,
0x0063, 0x0063, 0x4065, 0x0863, 0x1065, 0x1867, 0x2069, 0x286b,
0x306d, 0x0000, 0x0071, 0x0071, 0x00fc, 0x0073, 0x0073, 0x4075,
0x0873, 0x1075, 0x1877, 0x2079, 0x287b, 0x307d, 0x00fc, 0x0081,
0x0081, 0x4083, 0x0881, 0x1083, 0x1885, 0x2087, 0x2889, 0x308b,
0x007c, 0x008f, 0x008f, 0x4091, 0x088f, 0x1091, 0x1893, 0x2095,
0x2897, 0x085b, 0x0002, 0x00db, 0x00db, 0x38dd, 0x08db, 0x10dd,
0x18df, 0x20e1, 0x28e3, 0x0000, 0x00e7, 0x00e7, 0x00e9, 0x00ea,
0x00eb, 0x00ed, 0x00ef, 0x00f3, 0x00f7, 0x00ff, 0x0107, 0x0117,
};
```

8. Modifications

Various modifications can be made to the preferred embodiments while retaining the features of universal variable length decoding (UVLD) using a translation of a given VLC table into a VLD control table plus VLD code table and a prefix table (combinable with the control table) for Advanced UVLD. In particular, the exemplary VLC tables used could be replaced by others with differing bit allocations and symbol bits, bit complementary versions could be used, reordering the VLD code table entries and corresponding recomputation of the index, a three-tier or more decomposition (e.g., two-tier prefixes) for very large VLC tables may reduce memory required, and so forth.

What is claimed is:

1. A method of decoding variable length codes, comprising:

(a) providing a translation of a variable length code table into a variable length decode control table and a variable length decode code table;

(b) applying a universal decode function to an input bitstream, said input bitstream including sequences of codewords from said variable length code table, and said universal decode function interpreting said bitstream using said variable length decode control table to access said variable length decode code table to decode said codewords.

2. The method of claim 1, wherein said universal decode function:

(a) interprets a first set of bits from said bitstream as a codeword prefix;

(b) uses said prefix and a provided variable length decoding prefix table to determine (i) a maximum length for codewords with said prefix after removal of said prefix and (ii) a mask for bit complementation by XOR; and (c) uses said prefix and said mask applied to a second set of bits from said bitstream to access said variable length decode control table and then to find an index to access said variable length decode code table and decode one of said codewords.

3. The method of claim 1, wherein said universal decode function:

(a) interprets a first set of bits from said bitstream as a codeword prefix to determine a first location within said variable length control table;

(b) uses a first entry at said first location to interpret a second set of bits from said bitstream to determine a second location in said variable length control table;

(c) uses a second entry at said second location in said variable length decode control table to find an index to access said variable length decode code table and decode one of said codewords.

4. The method of claim 3, wherein:

(a) said first entry includes (i) a maximum length for codewords with said prefix after removal of said prefix and (ii) a mask for bit complementation by XOR of said second set of bits;

(b) said second entry includes (i) a shift and (ii) an offset; and (c) said index is computed as the XOR of said second set of bits followed by said shift and then by said offset.

* * * * *